United States Patent
Bour et al.

(10) Patent No.: US 9,484,492 B2
(45) Date of Patent: Nov. 1, 2016

(54) LED STRUCTURES FOR REDUCED NON-RADIATIVE SIDEWALL RECOMBINATION

(71) Applicant: Apple Inc., Cupertino, CA (US)

(72) Inventors: David P. Bour, Cupertino, CA (US); Kelly McGroddy, San Francisco, CA (US); Daniel Arthur Haeger, Fremont, CA (US); James Michael Perkins, Mountain View, CA (US); Arpan Chakraborty, Chandler, AZ (US); Jean-Jacques P. Drolet, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/853,614

(22) Filed: Sep. 14, 2015

(65) Prior Publication Data

US 2016/0197232 A1   Jul. 7, 2016

Related U.S. Application Data

(60) Provisional application No. 62/100,348, filed on Jan. 6, 2015.

(51) Int. Cl.
| | | |
|---|---|---|
| H01L 29/06 | (2006.01) | |
| H01L 31/00 | (2006.01) | |
| H01L 33/06 | (2010.01) | |
| H01L 33/38 | (2010.01) | |
| H01L 33/30 | (2010.01) | |

(52) U.S. Cl.
CPC ............ *H01L 33/06* (2013.01); *H01L 33/30* (2013.01); *H01L 33/38* (2013.01)

(58) Field of Classification Search
CPC ........ H01L 33/06; H01L 33/38; H01L 33/30
See application file for complete search history.

(56) References Cited

U.S. PATENT DOCUMENTS

| | | | |
|---|---|---|---|
| 5,138,624 A | 8/1992 | Hong et al. | |
| 5,614,734 A | 3/1997 | Guido | |
| 6,906,353 B1* | 6/2005 | Shieh | H01S 5/18308 257/94 |
| 2005/0233484 A1* | 10/2005 | Stein | H01L 33/44 438/22 |
| 2007/0145381 A1* | 6/2007 | Unno | H01L 33/145 257/79 |
| 2007/0187695 A1* | 8/2007 | Nakamura | H01L 29/0649 257/77 |

(Continued)

FOREIGN PATENT DOCUMENTS

| | | |
|---|---|---|
| EP | 0529990 A1 | 3/1993 |
| EP | 1187277 A2 | 3/2002 |

(Continued)

OTHER PUBLICATIONS

Bertone, D., "In-Situ Etching Technique, Inside MOCVD Reactor, for Fabrication of III-V Optoelectronic Devices," GAAS99, Munich 1999, pp. 303-308.

(Continued)

*Primary Examiner* — Victor A Mandala
(74) *Attorney, Agent, or Firm* — Blakely, Sokoloff, Taylor & Zafman LLP

(57) ABSTRACT

LED structures are disclosed to reduce non-radiative sidewall recombination along sidewalls of vertical LEDs including p-n diode sidewalls that span a top current spreading layer, bottom current spreading layer, and active layer between the top current spreading layer and bottom current spreading layer.

20 Claims, 32 Drawing Sheets

(56) References Cited

U.S. PATENT DOCUMENTS

| | | | |
|---|---|---|---|
| 2009/0014734 A1* | 1/2009 | Nishikawa | H01L 33/22 |
| | | | 257/95 |
| 2009/0257466 A1 | 10/2009 | Eberhard et al. | |
| 2011/0006320 A1* | 1/2011 | Koo | H01L 33/14 |
| | | | 257/94 |
| 2011/0147704 A1 | 6/2011 | Jiang et al. | |
| 2011/0227121 A1* | 9/2011 | Kato | H01L 33/0079 |
| | | | 257/99 |
| 2011/0272719 A1* | 11/2011 | Chen | H01L 33/14 |
| | | | 257/94 |
| 2013/0334563 A1* | 12/2013 | Lei | H01L 25/167 |
| | | | 257/99 |
| 2014/0353712 A1* | 12/2014 | Chang-Hasnain | H01S 5/1042 |
| | | | 257/103 |
| 2014/0367711 A1 | 12/2014 | Bibl et al. | |
| 2015/0187991 A1 | 7/2015 | McGroddy et al. | |
| 2016/0056339 A1* | 2/2016 | Sakai | H01L 33/0066 |
| | | | 257/76 |

FOREIGN PATENT DOCUMENTS

| | | |
|---|---|---|
| JP | S63-196089 A | 8/1988 |
| JP | H05-218498 A | 8/1993 |

OTHER PUBLICATIONS

Bour et al., "Self-aligned, buried heterostructure AlInGaAs laser diodes by micro-selective-area epitaxy" Applied Physics Letters vol. 85, No. 12, Sep. 20, 2004, pp. 2184-2186.

PCT International Search Report and Written Opinion for International Application No. PCT/US2015/064295, mailed Feb. 12, 2016, 14 pages.

* cited by examiner

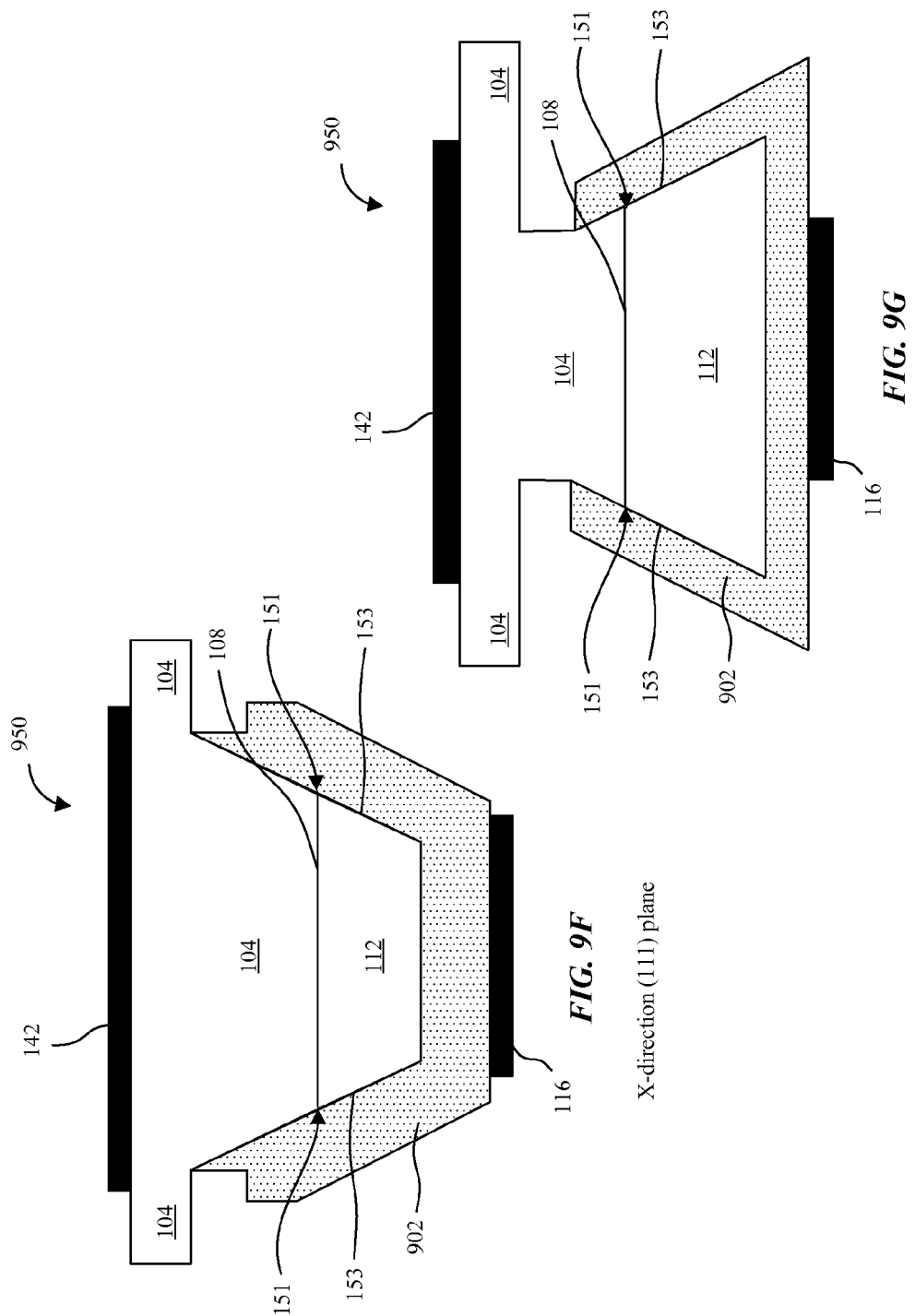

LED STRUCTURES FOR REDUCED NON-RADIATIVE SIDEWALL RECOMBINATION

RELATED APPLICATIONS

This application claims the benefit of priority from U.S. Provisional Application No. 62/100,348 filed Jan. 6, 2015, the full disclosure of which is incorporated herein by reference.

BACKGROUND

Field

Embodiments described herein relate LEDs. More particularly, embodiments relate to micro LEDs.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

One type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as mobile phones and digital cameras.

Another type of LED is an inorganic semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter ($cd/m^2$) and is also commonly referred to as a Nit (nt). Luminance increases with increasing operating current, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as the number of photons emitted divided by the number of electrons injected. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a characteristic value for the LED device.

BRIEF DESCRIPTION OF THE DRAWINGS

FIG. 9F is a cross-sectional side view along a x-direction (111) plane of a selectively grown LED with in-situ grown sidewall passivation layer in accordance with an embodiment.

FIG. 9G is a cross-sectional side view along a y-direction (111) plane of a selectively grown LED with in-situ grown sidewall passivation layer in accordance with an embodiment.

DETAILED DESCRIPTION

Figure 1A:
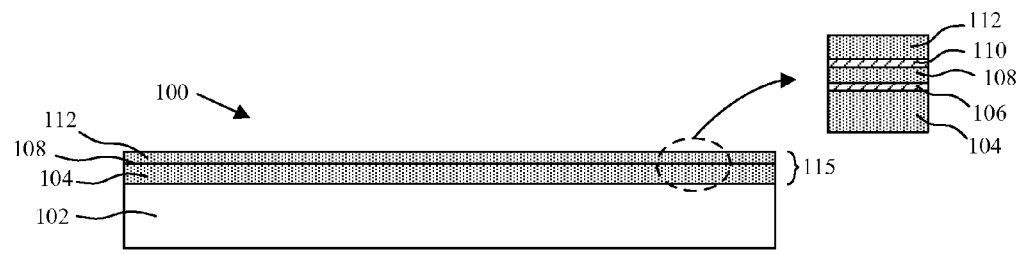
FIG. 1A is a cross-sectional side view illustration of a bulk LED substrate in accordance with an embodiment.

Embodiments describe LEDs and methods of forming LEDs with various structural configurations to mitigate non-radiative recombination at the LED sidewalls. For example, the various structures may include sidewall passivation techniques, current confinement techniques, and combinations thereof. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe LEDs, which may be micro LEDs, that include certain structural configurations to mitigate non-radiative recombination at the LED sidewalls. It has been observed that the sidewalls for emissive LEDs may represent non-radiative recombination sinks for injected carriers. This may be due to the sidewalls being characterized by unsatisfied bonds, chemical contamination, and structural damage (particularly if dry-etched). Injected carriers recombine non-radiatively at states associated with these defects. Thus, the perimeter of an LED may be optically dead, and the overall efficiency of the LED is reduced. This non-radiative recombination can also be a result of band bending at the surface leading to a density of states were electrons and holes can be confined until they combine non-radiatively. The characteristic distance over which the sidewall surface effect occurs is related to the carrier diffusion length, which may typically be 1-10 µm in some applications in accordance with embodiments. Thus, the efficiency degradation is particularly severe in micro LEDs in which the LED lateral dimensions approach the carrier diffusion length.

Such non-radiative recombination may have a significant effect on LED device efficiency, particularly when the LED is driven at low current densities in the pre-droop region of its characteristic internal quantum efficiency (IQE) curve where the current is unable to saturate the defects. In accordance with embodiments, sidewall passivation techniques, current confinement structures, and combinations thereof are described such that the amount of non-radiative recombination near the exterior or side surfaces of the active layer can be reduced and efficiency of the LED device increased.

In some embodiments, the term "micro" LED as used herein may refer to the descriptive size, e.g. length or width, of the LED. In some embodiments, "micro" LEDs may be on the scale of 1 μm to approximately 300 μm, or 100 μm or less in many applications. More specifically, in some embodiments, "micro" LEDs may be on the scale of 1 μm to 20 μm, such as 10 μm or 5 μm where the LED lateral dimensions approach the carrier diffusion length. However, it is to be appreciated that embodiments are not necessarily so limited, and that certain aspects of the embodiments may be applicable to larger, and possibly smaller size scales.

In an embodiment, the sidewall surface of the LED including at least the active layer is passivated in order to restore the radiative efficiency of the LEDs. A variety of different structural configurations are disclosed for sidewall passivation including various regrowth and diffusion techniques. Such sidewall passivation may have several effects depending upon the particular passivation technique. One effect may be to preserve the lattice structure and minimize defects at the LED sidewalls and/or active layer edges, thereby mitigating the effects of non-radiative combination at the LED sidewalls and/or active layer edges. Another effect may be to move the LED sidewalls and/or active layer edges to an interior of the p-n diode layer, such that the current injection path is confined internally with the p-n diode layer away from the p-n diode layer sidewalls where defects might be present.

In an embodiment, an in-situ etch is performed to form the LED sidewalls adjacent the active layer. For example, this is performed in an MOCVD epitaxial growth reactor. In this manner, the purely chemical etch introduces minimal structural damage compared to dry etching techniques such as ICP/RIE. The in-situ etch is then followed immediately by in-situ epitaxial regrowth of the sidewall passivation layer on the newly-created surface. Since there is no air exposure, oxidation of the sidewall is eliminated. Since the passivation layer is grown epitaxially on the LED sidewalls, any dangling bonds at the free surface (prior to regrowth) are satisfied. Thus, the lattice structure is preserved and defects are minimized at the LED sidewalls. In this manner, the surface recombination at the LED sidewalls may be mitigated.

In some embodiments, diffusion techniques result in moving the LED sidewalls and/or lateral edges of the active layer (e.g. including one or more quantum wells) to an interior of the p-n diode layer. Thus, by forming a passivation layer within the p-n diode layer and laterally around the internally confined active layer, a barrier is created to the lateral carrier diffusion from the active layer. Such a barrier may prevent lateral carrier diffusion from the active layer edges to the adjacent p-n diode layer sidewalls where defects might be present. Thus, the passivation layer may be narrower than the above mentioned carrier diffusion length of 1-10 μm in some embodiments.

A variety of other structural configurations are described to passivate the LED sidewalls, and reduce surface recombination. In an embodiment, epitaxial growth of the sidewall passivation layer is performed ex-situ. For example, this may be performed after vapor etching the LED sidewalls for a GaN-based LED.

In an embodiment, sidewall passivation is accomplished by diffusion into the exposed p-n diode layer sidewalls to displace the edges of the active layer into an interior of the p-n diode layer.

In an embodiment, the active layer is formed within the interior of the LED by diffusion. In this manner, the current injection path is directed internally through the LED and away from the sidewalls.

In an embodiment, LED mesas are selectively grown followed by in-situ growth of a sidewall passivation layer to cover the active layer edges.

In an embodiment, the LED active layer and cladding layers are grown over a patterned substrate such that n-doping and p-doping within the layers is dependent upon orientation of the surface. For example, in an embodiment, p-dopants and n-dopants are simultaneously flowed into the chamber where they are preferentially deposited on different exposed planes.

In an embodiment, the active layer is selectively etched to produce a notch between the n-doped cladding layer (or current spreading layer) and the p-doped cladding layer (or current spreading layer). This notch is then filled by mass transport, resulting in edges of the active layer being confined to an interior of the p-n diode layer.

In an embodiment, the bandgap energy at the p-n diode layer sidewalls is increased by surface conversion. For example, the p-n diode layer sidewalls may be exposed to a vapor chemistry at high temperature in which a group V species evaporates (e.g. As) and is replaced by a group V vapor species (e.g. P). In this manner, the higher bandgap energy at the sidewall surfaces effectively confines the active layer to an interior of the p-n diode layer.

In an embodiment, deposition conditions and layer strain are controlled in order to take advantage of the miscibility gap of the deposition components in the active layer and form a non-homogenous composition in which certain species segregate and form clumps. In this manner, a quantum dot effect is achieved in which lateral spreading across the active layer is reduced, and resultant sidewall recombination at the surface is reduced.

In an embodiment, nanopillars are formed by selective growth or patterning. The formation of nanopillars may contribute to the quantum dot effect that takes advantage of carrier localization at the dot or pillar, which may reduce lateral spreading across the active layer. The formation of nanopillars may additionally increase the surface area within the active layer, thereby lessening the relative surface area of the active layer at the LED sidewalls.

In an embodiment, selective diffusion is utilized to create vacancies, causing interdiffussion at the p-n diode layer sidewalls. In this manner, a higher bandgap energy is created at the sidewall surfaces that effectively confines the active layer to an interior of the p-n diode layer.

In an embodiment, atomic layer deposition (ALD) is utilized to form a sidewall passivation layer (e.g. $Al_2O_3$) surrounding p-n diode layer sidewalls.

In accordance with some embodiments, any of the above structural configurations may be combined with a current spreading layer pillar structure. For example, either of the p-doped or n-doped layers in a p-n configuration may be considered as current spreading layers. In an embodiment, either of the current spreading layers is patterned such that it is narrower than the active layer including the p-n diode. In some of the exemplary embodiments illustrated, the bottom current spreading layer (e.g. p-doped layer) is patterned to form a pillar structure with reduced width. In this manner, when a potential is applied across the LED, the current injection area within the active layer is modified by the relationship of the areas of the bottom current spreading layer pillar and top current spreading layer. In operation, the current injection area is reduced as the area of the bottom current spreading layer pillar configuration is reduced. In this manner, the current injection area can be confined internally within the active layer away from external or side surfaces of the active layer.

In addition, when a current spreading layer pillar structure is employed it is possible to design an LED in which a top surface area of the top surface of the p-n diode layer is larger than a surface area of the current confinement region within the active layer. This enables larger LED devices to be fabricated, which may be beneficial for transferring the LED devices using an electrostatic transfer head assembly, while also providing a structure in which the confined current injection area results in an increased current density and increased efficiency of the LED device, particularly when operating at injection currents and injection current densities below or near the pre-droop region of the LED device IQE curve.

In the following description exemplary processing sequences are described for forming an array of LEDs, which may be micro LEDs. Referring now to FIG. 1A, a cross-sectional side view illustration is provided of a bulk LED substrate 100 including a p-n diode layer 115 formed on the growth substrate in accordance with an embodiment. For example, the p-n diode layer 115 illustrated in FIG. 1A may be designed for emission of primary red light (e.g. 620-750 nm wavelength), primary green light (e.g. 495-570 nm wavelength), or primary blue light (e.g. 450-495 nm wavelength), though embodiments are not limited to these exemplary emission spectra. The p-n diode layer 115 may be formed of a variety of compound semiconductors having a bandgap corresponding to a specific region in the spectrum. For example, the p-n diode layer 115 can include one or more layers based on II-VI materials (e.g. ZnSe) or III-V materials including III-V nitride materials (e.g. GaN, AlN, InN, InGaN, and their alloys), III-V phosphide materials (e.g. GaP, AlGaInP, and their alloys), and III-V arsenide alloys (AlGaAs). The growth substrate 100 may include any suitable substrate such as, but not limited to, silicon, SiC, GaAs, GaN, and sapphire.

The p-n diode layer 115 can include a variety of configurations depending upon application. Generally, the p-n diode layer 115 includes a current spreading layer 104 of a first dopant type (e.g. n-doped), a current spreading layer 112 of opposite dopant type (e.g. p-doped), and an active layer 108 between the current spreading layers 104,112. For example, the active layer 108 may be a single quantum well (SQW) or multi-quantum well (SQW) layer. In an embodiment, a reduced number of quantum wells may offer more resistance to lateral current spreading, higher carrier density, and aid in confining current internally within the completed LED. In an embodiment, active layer 108 includes a SQW. In an embodiment, active layer 108 is a MWQ structure with less than 10 quantum well layers. In an embodiment, active layer 108 is a MWQ structure with 1-3 quantum wells. Additional layers may optionally be included in the p-n diode layer 115. For example, cladding layers 106, 110 may be formed on opposite sides of the active layer 108 to confine current within the active layer 108 and may possess a larger bandgap than the active layer 108. Cladding layers 106, 110 may be doped to match the doping of the adjacent current spreading layers 104, 112. In an embodiment, cladding layer 106 is doped with an n-type dopant, and cladding layer 110 is doped with a p-type dopant, or vice versa. In accordance with embodiments, the current spreading layers may be functionally similar to cladding layers.

By way of example, in an embodiment the p-n diode layer 115 is design for emission of red light, and the materials are phosphorus based. The followed listing of materials for red emission is intended to be exemplary and not limiting. For example, the layers forming the p-n diode layer 115 may include AlInP, AlInGaP, AlGaAs, GaP, and GaAs. In an embodiment, current spreading layer 104 includes n-AlInP or n-AlGaInP, cladding layer 106 includes n-AlInGaP, cladding layer 110 includes p-AlGaInP, and current spreading layer 112 includes p-GaP or p-AlInP. Quantum well 108 may be formed of a variety of materials, such as but not limited to, AlGaInP, AlGaAs, and InGaP. In such an embodiment, a suitable growth substrate 102 may include, but not limited to, silicon, SiC, and GaAs.

By way of example, in an embodiment, the p-n diode layer 115 is designed for emission of blue or green light, and the materials are nitride based. The followed listing of materials for blue or green emission is intended to be exemplary and not limiting. For example the layers forming the p-n diode layer 115 may include GaN, AlGaN, InGaN. In an embodiment, current spreading layer 104 includes n-GaN, cladding layer 106 is optionally not present, cladding layer 110 includes p-AlGaN, and current spreading layer 112 includes p-GaN. Quantum well 108 may be formed of a variety of materials, such as but not limited to, InGaN. In such an embodiment, a suitable growth substrate 102 may include, but is not limited to, silicon and sapphire. In an embodiment, cladding layer 106 may not be necessary for nitride based LEDs due to internal piezoelectric and spontaneous polarization fields.

Figure 1B:
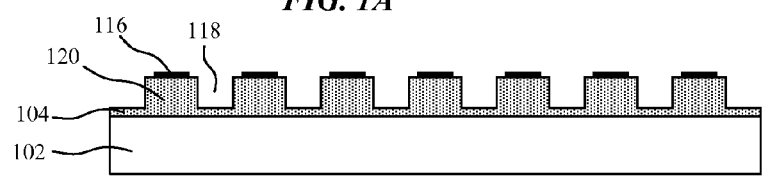
FIGS. 1B-1F are cross-sectional side view illustrations of a one-sided process sequence for fabricating an array of LEDs in accordance with embodiments.
Figure 1C:
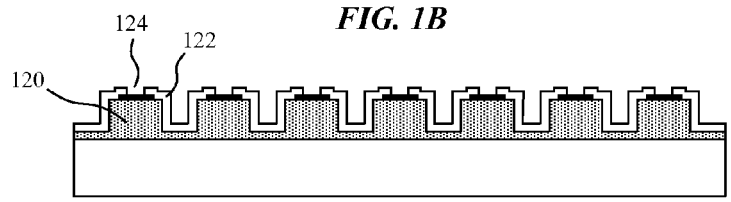

FIGS. 1B-1F are cross-sectional side view illustrations of a one-sided process sequence for fabricating an array of LEDs. As shown in FIG. 1B, an array of conductive contacts 116 are formed over the p-n diode layer 115, and the p-n diode layer 115 is etched to form trenches 118 between mesa structures 120. Conductive contacts 116 may include a multiple layer stack. Exemplary layers can include electrode layers, mirror layers, adhesion/barrier layers, diffusion barriers, and a bonding layer for bonding the completed LEDs to a receiving substrate. In an embodiment, the conductive contacts 116 are formed on a p-doped current spreading layer 112, and are functionally p-contacts. Etching can be performed utilizing a suitable technique such as dry etching or wet etching. In the embodiment shown in FIG. 1B, trenches are not formed completely through the n-doped current spreading layer 104. Alternatively, trenches are formed completely through the n-doped current spreading layer 104. In some embodiments, pillars are partially through the p-doped current spreading layer 112 (see FIG. 3). For example, the structure formed in FIG. 3 can be made using a one-sided process, or a two-sided process where the pillars are formed using the one-sided process, and the mesa structures are etched after transferring to the receiving substrate using a two-sided process.

Following the formation of the mesa structures 120, a sacrificial release layer 122 may be formed over the patterned p-n diode layer 115, and then patterned to form openings 124 over the conductive contacts 116. The sacrificial release layer 122 may be formed of an oxide (e.g. $SiO_2$) or nitride (e.g. $SiN_x$), though other materials may be used which can be selectively removed with respect to the other layers. The height, width, and length of the openings 124 will correspond to the height, length, and width of the stabilization posts to be formed, and resultantly the adhesion strength that must be overcome to pick up the array of LEDs (e.g. micro LEDs) that are poised for pick up on the array of stabilization posts.

Figure 1D:
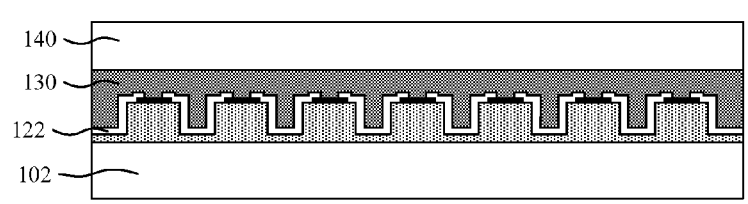

Referring now to FIG. 1D, the patterned structure on the growth substrate 102 is bonded to a carrier substrate 140 with an adhesive bonding material to form stabilization layer 130. In an embodiment, the adhesive bonding material is a thermosetting material such as benzocyclobutene (BCB) or epoxy. The portion of the stabilization material that fills openings 124 corresponds to the stabilization posts 132 of the stabilization layer, and the portion of the stabilization material that fills the trenches 118 becomes the stabilization cavity sidewalls 134 of the stabilization layer.

Figure 1E:
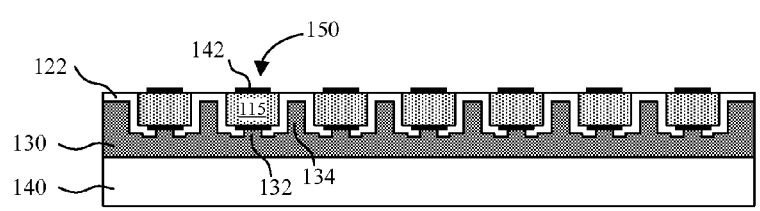
Figure 1F:
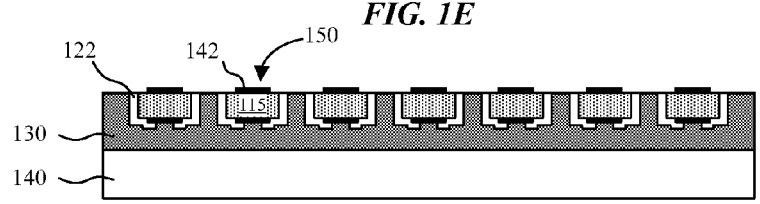

After bonding to the carrier substrate 140, the growth substrate may be removed utilizing a suitable technique such as laser lift-off, etching, or grinding to expose the p-n diode layer 115. Any remaining portions of the n-doped current spreading layer 104 connecting the separate mesa structures 120 may then be removed using etching or grinding to form laterally separate p-n diode layers 115. A top conductive contact layer 142 may then be formed over each laterally separate p-n diode layer resulting LED 150. FIGS. 1E and 1F represent alternative structures that may be obtained, depending upon the amount of material removed after removal of the growth substrate 102 and etching or grinding back to expose the mesa structures 120.

In a one-sided process described above the p-n diode layer 115 is patterned to form mesa structures 120 prior to be being transferred to a carrier substrate 140. Alternatively, LEDs in accordance with embodiments can be fabricated utilizing a two-sided process in which the p-n diode layer 115 is transferred from the growth substrate to a carrier substrate 140, followed by patterning of the p-n diode layer to form mesa structures 120. A variety of processing techniques can be used to obtain similar final structures including sidewall passivation techniques, current confinement techniques, and combinations thereof. Accordingly, while the LEDs structures in the following description are all described using a one-sided processing sequence, this is illustrative and not meant to be limiting.

Figure 2:
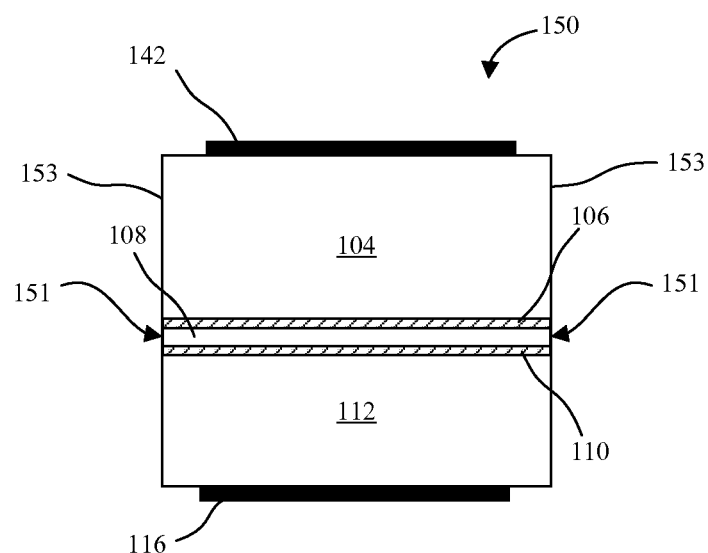
FIG. 2 is a cross-sectional side view illustration of an LED including active layer edges along sidewalls of the LED.
Figure 3:
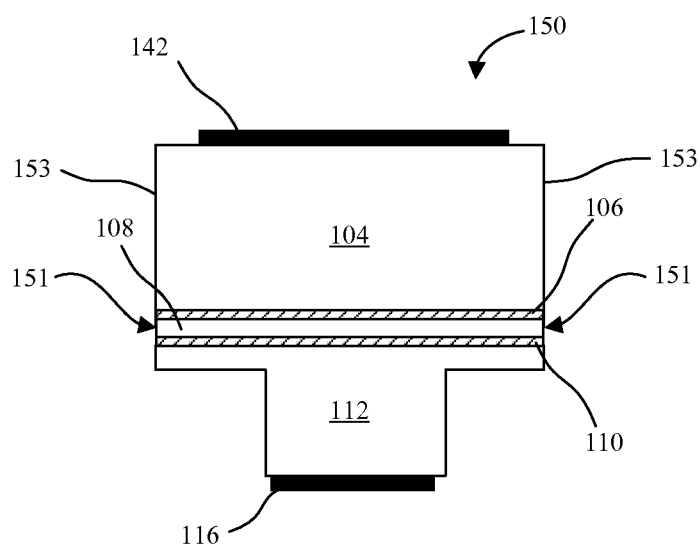
FIG. 3 is a cross-sectional side view illustration of an LED with a bottom current spreading layer pillar structure with a reduced width compared to the active layer in accordance with an embodiment.

FIGS. 2-3 are exemplary cross-sectional side view illustrations of LEDs that may be formed using a one-sided process similar to the one described with regard to FIGS. 1B-1F. FIG. 2 is a cross-sectional side view illustration of an LED including active layer 108 edges 151 along sidewalls 153 of the p-n diode layer. FIG. 3 is a cross-sectional side view illustration of an LED with a bottom current spreading layer 112 pillar structure with a reduced width compared to the active layer 108. In the particular structure illustrated in FIG. 3, the current spreading layer pillar 112 may be function to internally confine the current injection path away from the active layer 108 edges 151 along sidewalls 153 of the p-n diode layer. In each FIG. 2 and FIG. 3, the edges 151 of the active layer 108 may be damaged as a result of etching the sidewalls 153 of the p-n diode layer 115 mesa structures 120. Accordingly, edges of the active layer may be a site for non-radiative recombination. In accordance with embodiments described herein, various structural configurations are described to mitigate non-radiative recombination at the edges of the active layer. For example, the various structures may include sidewall passivation techniques, current confinement techniques, and combinations thereof.

Referring now to FIGS. 4A-4E cross-sectional side view illustrations are provided for a method of forming an LED with an in-situ regrown p-n junction sidewall passivation layer in accordance with an embodiment. The particular processing sequence illustrated in FIGS. 4A-4E may be generic for LEDs of any emission color, including red, blue, and green and may include any of the p-n diode layer 115 configurations described above with regard to FIG. 1A. Furthermore, the processing sequence illustrated in FIGS. 4A-4E may include in-situ etching and regrowth. As shown, a mask 117 is formed over the p-n diode layer 115 to etch trenches 118 at least partially into the doped current spreading layer 104. The mask 117 may be formed with a dielectric material, such as $SiO_2$, that can survive the high temperatures and aggressive etch chemistries associated with the etch and regrowth processes. In an embodiment, the etching process is a purely chemical etch that is performed in an metal organic chemical vapor deposition (MOCVD) chamber. In an embodiment, trenches 118 are formed by a first partial dry etch, and then the wafer is transferred to an MOCVD chamber to complete etching of the trenches 118. In this manner, the final etched surfaces are conditioned by etching in the MOCVD chamber and physical damage created during the dry etching operation is removed by the chemical etching in the MOCVD chamber. Exemplary dry etching techniques that may be used include reactive ion etching (RIE), electro-cyclotron resonance (ECR), inductively coupled plasma reactive ion etching (ICP-RIE), and chemically assisted ion-beam etching (CAME). The dry etching chemistries may be halogen based, containing species such as $Cl_2$, $BCl_3$, or $SiCl_4$. The etching temperature within the MOCVD chamber may additionally be at an elevated temperature, such as 400° C.-700° C. The specific etching chemistry may include a combination of a corrosive etchant and group V decomposition suppressant to stabilize the group V element, and suppress decomposition that may otherwise occur at the elevated etching temperature.

In an embodiment, the LED is designed for red emission, and the p-n diode layer 115 is phosphorus based. In such an embodiment, the etching chemistry includes a corrosive etchant such as HCl or $Cl_2$, and a group V decomposition suppressant such as $PH_3$. In an embodiment, the LED is designed for green or blue emission, and the p-n diode layer 115 is nitride-based. In such an embodiment, the etching chemistry includes a corrosive etchant such as HCl, $Cl_2$, or $H_2$ (or combinations thereof), and a group V decomposition suppressant such as $NH_3$.

Following the formation of trenches 118, a passivation layer 402 is epitaxially regrown in the trenches 118. The regrowth of passivation layer 402 is performed in-situ in the MOCVD chamber immediately after etching trenches 118, and without exposure to air or removal from the MOCVD chamber. Since the passivation layer 402 is epitaxially regrown on a pristine surface, it serves as surface passivator to the p-n diode, and specifically the active layer 108. In accordance with embodiments, the passivation layer 402 has a higher bandgap than the individual layers within the p-n diode layer 115. The passivation layer 402 may also be p-type. For phosphorus based red emitting LEDs, the passivation layer 402 may be p-doped with Mg or Zn dopants. For example, the passivation layer may be AlInGaP:Mg,Zn. For nitride-based green or blue emitting LEDs, the passivation layer 402 may be p-doped with Mg. For example, the passivation layer may be AlGaN:Mg. For nitride-based green or blue emitting LEDs, the passivation layer 402 may be made insulating with C or Fe dopants. For example, the passivation layer may be AlGaN:C,Fe.

Figure 4A:
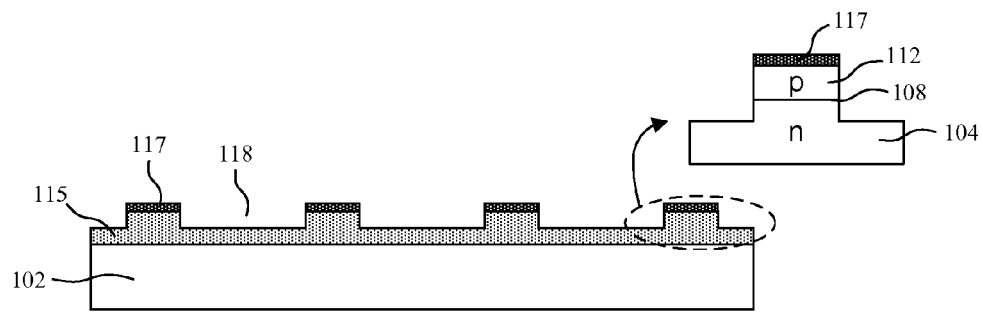
FIGS. 4A-4E are cross-sectional side view illustrations of a method of forming an LED with an in-situ regrown p-n junction sidewall passivation layer in accordance with an embodiment.
Figure 4B:
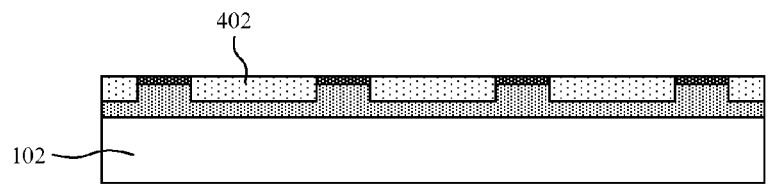
Figure 4C:
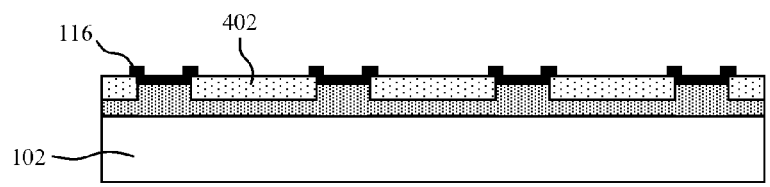
Figure 4D:
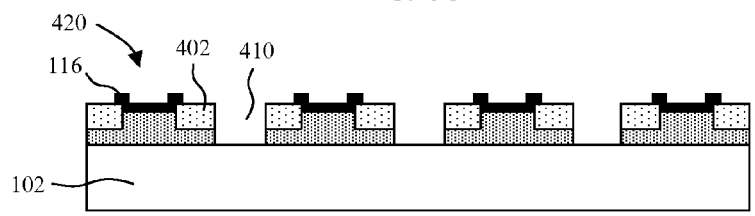
Figure 4E:
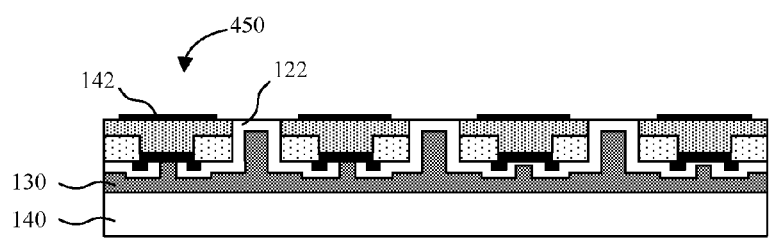

Mask 117 may then be removed, followed by the formation of conductive contacts 116 on the exposed portion of the p-n diode layer 115 (e.g. p-doped current spreading layer 112) as illustrated in FIG. 4C. Trenches 410 are then etched through the passivation layer 402 and p-n diode layer 115 to form mesa structures 420 as illustrated in FIG. 4D. For example, dry etching techniques may now be used. Alternatively, trenches 410 are wet etched to reduce the surface damage to sidewalls of the p-n diode layer 115, which become p-n diode layer sidewalls 153 of the LED. In another embodiment, a combination of dry etching followed by wet etching is used. The mesa structures 420 may then be transferred to the carrier substrate 140 and top conductive contact 142 formed similarly as discussed above with regard to FIGS. 1B-11F.

Figure 4F:
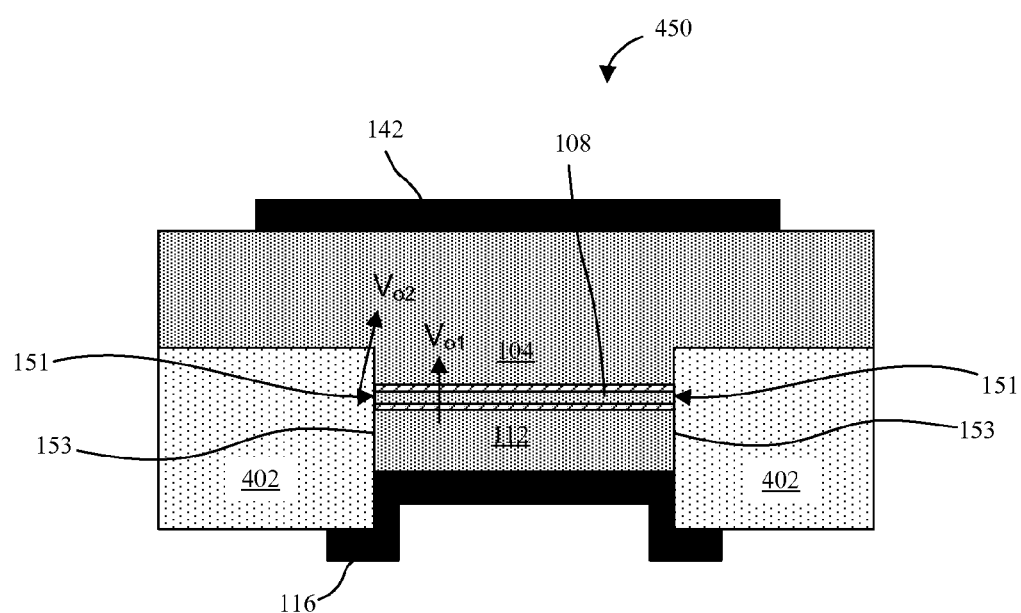
FIG. 4F is a cross-sectional side view illustration of an LED with an in-situ regrown p-n junction sidewall passivation layer in accordance with an embodiment.

FIG. 4F is a cross-sectional side view illustration of an LED with an in-situ regrown p-n junction sidewall passivation layer in accordance with an embodiment. As shown, the passivation layer 402 laterally surrounds the LED sidewalls 151, which also correspond to the edges of the active layer 108, and the p-n diode layer sidewalls 153. In such an embodiment, since the in-situ etch is purely chemical, introducing no structural damage, and because there is no air exposure, chemical contamination is eliminated. The passivation layer 402 is epitaxially grown, thereby satisfying all bonds at the original surface. In this manner, the surface recombination is minimized and the LED's radiative efficiency is restored. Still referring to FIG. 4F, the regrown p-n junction passivation layer 402 may be formed of a high bandgap material, and therefore has a higher turn-on voltage ($V_{o2}$) than the emitting p-n junction $V_{o1}$, i.e. $V_{o2} > V_{o1}$. As a result, the current will preferentially flow through the intended region which emits light.

FIGS. 5A-5H are cross-sectional side view illustrations of a method of forming an LED with vapor etched sidewalls and a regrown sidewall passivation layer in accordance with an embodiment. In an embodiment, the processing sequence illustrated in FIGS. 5A-5H is directed toward green or blue emitting, nitride-based LEDs. As described above, AlGaN cladding layer 106 may be omitted due to internal piezoelectric and spontaneous polarization fields. Furthermore, cladding layer 110 may additionally omitted from the p-n diode layer illustrated in FIG. 5A. As described above, micro LEDs in accordance with embodiments may operate at lower currents than conventional LEDs. Accordingly, in an embodiment, the AlGaN cladding layers 106, 110 may not be necessary in either side of the quantum well 108. In an embodiment, the p-n diode layer 115 includes a p-GaN layer 112, InGaN active layer 108, and n-GaN layer 104.

Figure 5A:
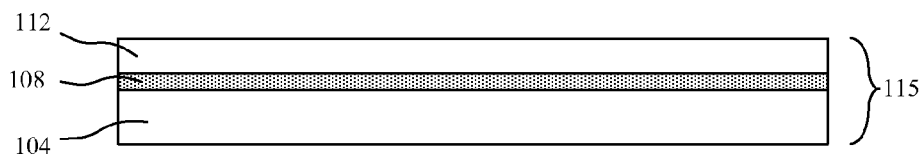
FIGS. 5A-5H are cross-sectional side view illustrations of a method of forming an LED with vapor etched sidewalls and a regrown sidewall passivation layer in accordance with an embodiment.
Figure 5B:
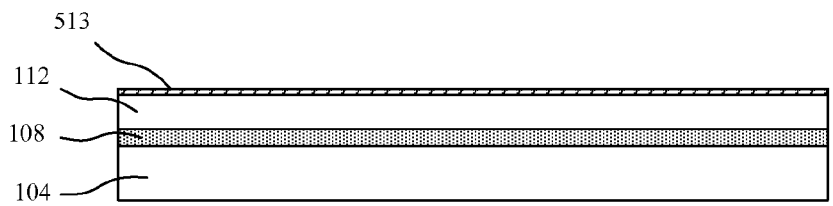
Figure 5C:
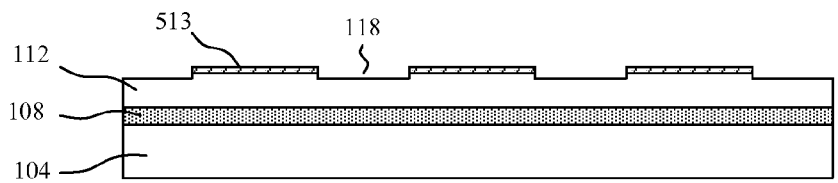
Figure 5D:
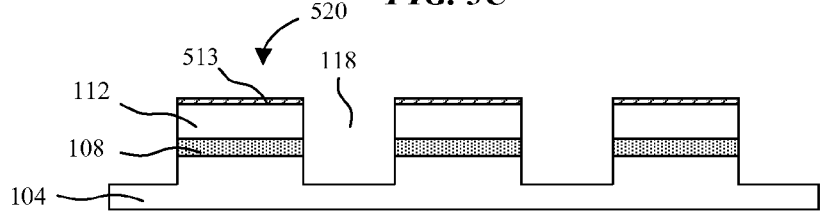
Figure 5E:
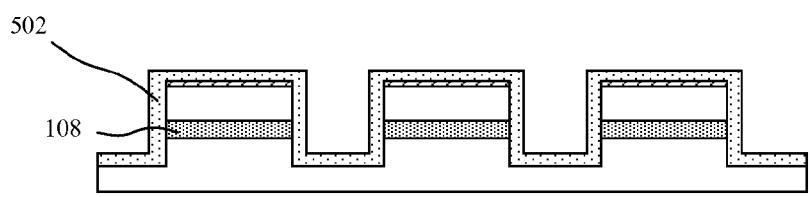
Figure 5F:
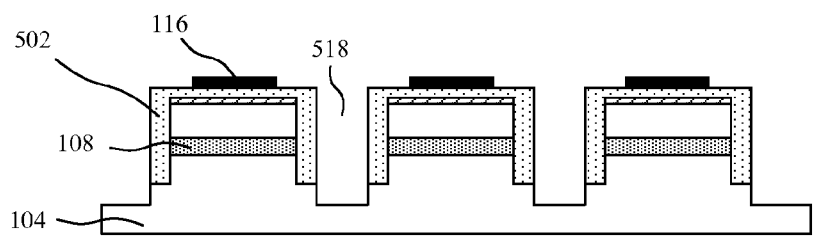
Figure 5G:
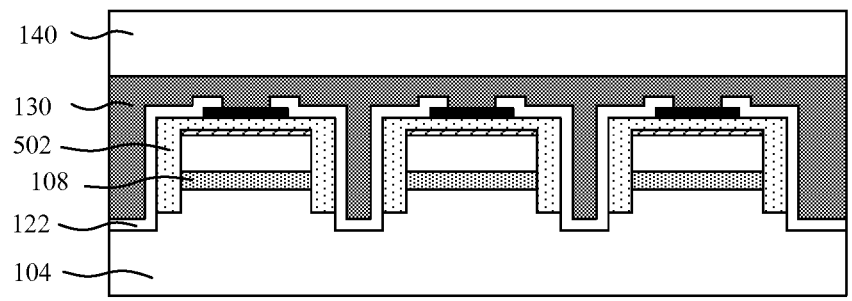
Figure 5H:
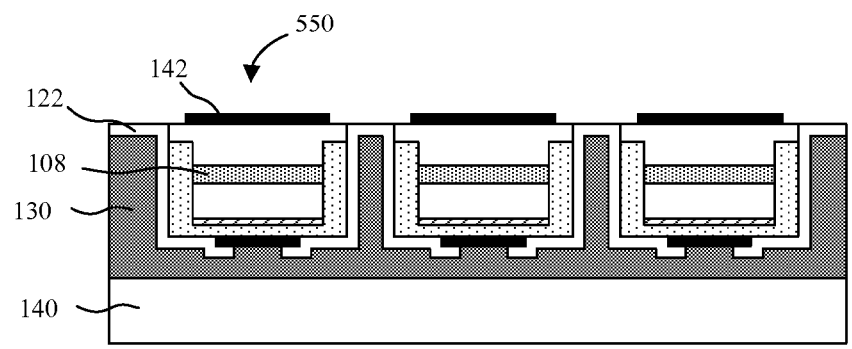

As illustrated in FIG. 5B, a thin semiconductor mask layer 513 is formed over the p-n diode layer 115. In an embodiment, semiconductor mask layer 513 is formed of AlGaN. Referring now to FIGS. 5C-5D, trenches 118 are etched at least partially through the p-n diode layer 115 to form the mesa structures 520. Initially RIE/ICP etching may be used to etch a shallow trench 118 through the AlGaN semiconductor mask layer 513. This may be followed by a $H_2+NH_3$ vapor etching at high temperature to complete the etching of trenches 118. For example, $H_2+NH_3$ vapor etching may result in minimal structural damage compared to RIE/ICP etching, and can be etched at a planar rate of approximately 200 nm/hour, forming vertical m-plane sidewalls. Since, AlGaN cladding layers 106, 110 are not present they will not interfere with or block the $H_2+NH_3$ vapor etching. When the trenches are properly oriented, vertical sidewalls may be obtained.

Figure 5I:
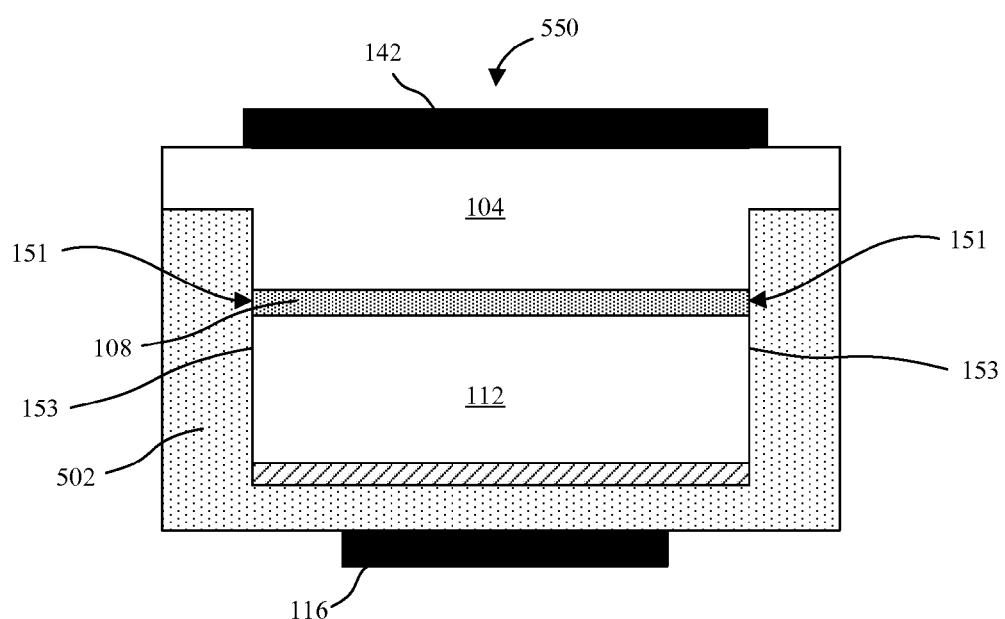
FIG. 5I is a cross-sectional side view illustration of an LED with a regrown sidewall passivation layer in accordance with an embodiment.

Referring now to FIGS. 5E-5H, an epitaxially regrown passivation layer 502 can be formed over the patterned p-n diode layer and semiconductor mask layers 513. For example, passivation layer 502 may be regrown p-GaN. In accordance with embodiments, epitaxial regrowth of passivation layer 502 is ex-situ from the vapor etching of trenches 118. In the exemplary embodiment, there are no aluminum-containing layers within the p-n diode layer 115, and accordingly, the sidewalls of the mesa structures 520 are not oxidized after vapor etching. Accordingly, the epitaxially regrown passivation layer 502 may match the lattice structure of the vapor etched sidewalls with minimal defects. In a particular embodiment, the passivating layer 502 is epitaxially regrown in-situ, i.e., immediately after vapor etch in an MOCVD reactor, so that there is no air-exposure. Trenches 518 are then etched through epitaxially regrown passivation layer 502, and the structure transferred to a carrier substrate 140 as previously described. FIG. 5I is a cross-sectional side view illustration of an LED with a regrown sidewall passivation layer in accordance with an embodiment. As illustrated, the LED 550 includes passivation layer 502 formed around the sidewalls 153 and underneath the p-n diode layer 115, and the bottom conductive contact 116 is formed on the p-doped passivation layer 502. As shown, the passivation layer 502 does not completely cover sidewalls of the n-doped current spreading layer 104, and does not reach the top surface of the p-n diode layer. In this manner, a p-n junction is created at the interface of 502-104 which has a higher turn-on voltage than at the active layer 108, and current preferentially flows through the intended region which emits light. Additionally, in the embodiment illustrated, the passivation layer 502 laterally surrounds the active layer 108 within the LED 550 such that edges 151 of the active layer 108 are passivated by the passivation layer 502.

Figure 6A:
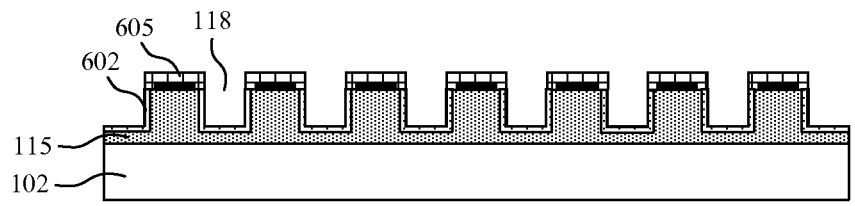
FIGS. 6A-6E are cross-sectional side view illustrations of a method of forming an LED with a diffused sidewall passivation layer in accordance with an embodiment.
Figure 6B:
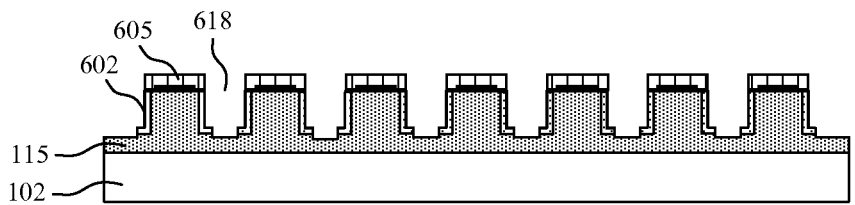
Figure 6C:
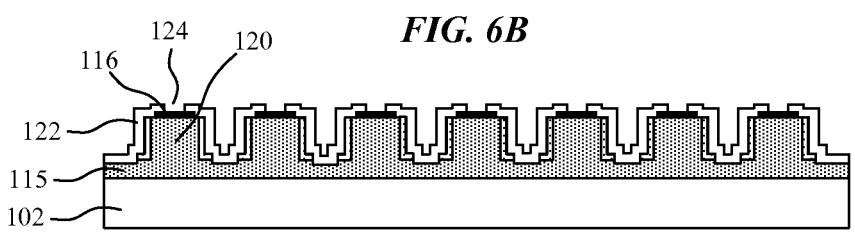
Figure 6D:
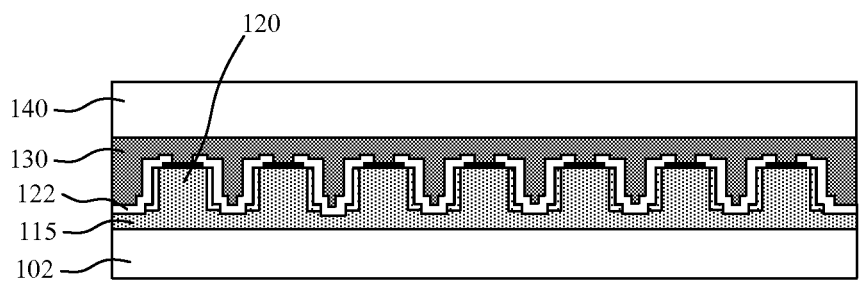
Figure 6E:
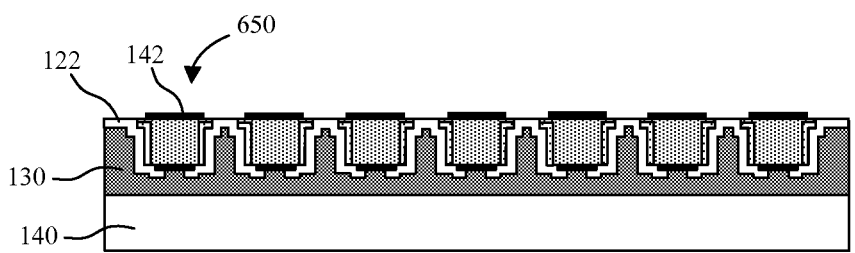

FIGS. 6A-6E are cross-sectional side view illustrations of a method of forming an LED with a diffused sidewall passivation layer in accordance with an embodiment. In an embodiment, FIGS. 6A-6E are directed toward phosphorus based LEDs designed for emission of red light. In an embodiment, p-n diode layer 115 includes any of the compositions discussed above with regard to FIG. 1A. Referring now to FIG. 6A, the p-n diode layer 115 is patterned to form trenches 118 at least partially through current spreading layer 104. A mask 605 may be used to define the mesa structures 120 during etching of the trenches 118. Following the formation of trenches 118 a diffusion operation is performed to diffuse a species into the sidewalls of the mesa structures 120 and form passivation layer 602. Diffusion may additionally occur on the exposed surface of the p-n diode layer 115 between the mesa structures 120, and optionally on top of the mesa structures 120 if the mask 605 has been removed. The diffusion and formation of passivation layer 602 displaces the previously exposed p-n junction (and active layer 108) into an interior of the LED. As a result, the p-n junction does not intersect the surface, and is formed of undamaged material. In one particular embodiment, an intermixed heterostructure is created. Specifically, in this embodiment, the AlInGaP heterostructure is grown under conditions and substrate orientation to spontaneously produce an ordered alloy crystal structure (CuPt-type ordering which comprises a GaAlP-InP monolayer superlattice on the (111) crystal planes). The ordered alloy cladding layer 106 (e.g. n-AlInGaP), quantum well layer 108 (InGaP), and cladding layer 110 (e.g. p-AlGaInP) are characterized by a lower bandgap energy. The above-described diffusion process may randomize this alloy, thereby raising its bandgap energy. The randomized sidewall, with higher bandgap energy, naturally forms a potential barrier which suppresses sidewall recombination. Thereby the randomized AlInGaP forms a passivation layer 602. A variety of methods may be employed to form the passivation layer 602, including implantation, vapor diffusion, and coating a source layer followed by heating (solid source diffusion).

In an embodiment, a p-dopant such as Zn or Mg is implanted and/or diffused to change the n-type layers (110, 112) to p-type in the passivation layer 602. Alternatively, another species such as Fe, Cr, Ni, or another dopant can be added to make the passivation layer 602 semi-insulating. Alternatively, He or H can be implanted, also known as proton bombardment or proton implantation. The damage created by proton bombardment in turn increases the resistivity of the implanted passivation layer 602. Implantation energy may be controlled so as to not create too much damage so as to act as a significant source for non-radiative recombination.

Figure 6F:
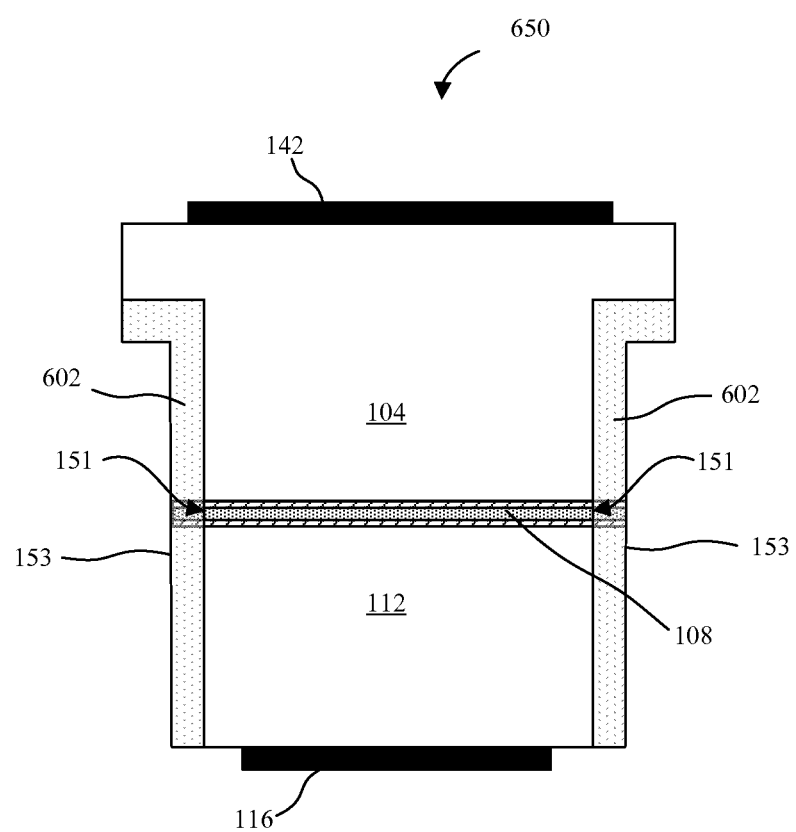
FIG. 6F is a cross-sectional side view illustration of an LED with a diffused sidewall passivation layer in accordance with an embodiment.

Following the formation of the passivation layer 602, the structure may be processed similarly as described above with regard to FIGS. 1B-1F to form LEDs 650. FIG. 6F is a cross-sectional side view illustration of an LED with a diffused sidewall passivation layer in accordance with an embodiment. As illustrated, the LED 650 includes passivation layer 602 formed within the sidewalls 153 of the p-n diode layer 115. As shown, the passivation layer 602 does not completely cover sidewalls of the n-doped current spreading layer 104, and does not reach the top surface of the p-n diode layer. In this manner, a p-n junction is created at the interface of 602-104 in which has a higher turn-on voltage than at the active layer 108, and current preferentially flows through the intended region which emits light. Additionally, in the embodiment illustrated, the passivation layer 602 laterally surrounds the active layer 108 within the LED 650 such that the LED sidewalls 151 (corresponding to the edges of the active layer 108) are internally confined within the p-n diode layer sidewalls 153 that have been converted to passivation layer 602.

FIGS. 7A-7E are cross-sectional side view illustrations of a method of forming a p-n junction within an LED by selective diffusion in accordance with an embodiment. In the particular embodiment illustrated in FIG. 7A, the epitaxial layer 715 differs slightly from the p-n diode layer 115 illustrated in FIG. 1A in that layers 710, 712 are n-doped rather than p-doped (layers 110, 112). Thus, the starting epitaxial layer 715 includes an n-/n heterostructure, and a p-n junction is not yet formed. In an embodiment, epitaxial layer 715 includes (n)-AlInP current spreading layer 104, (n)-AlInGaP cladding layer 106, quantum well layer 108, (n-)-AlGaInP cladding layer 710, and (n-) AlInP current spreading layer 712. In accordance with the embodiment illustrated in FIGS. 7A-7E the p-n junction is formed by diffusion of a p-dopant such as Mg or Zn into current spreading layer 712, and cladding layer 710. Diffusion can be from a solid source, or vapor as described above with regard to FIG. 6A-6E.

Figure 7A:
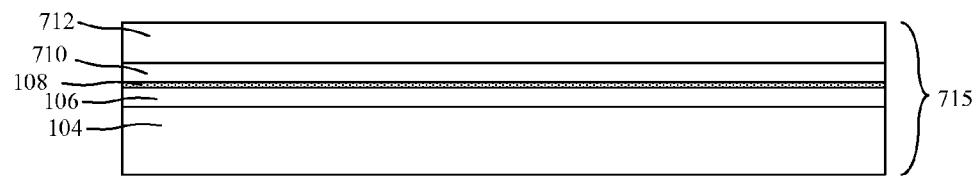
FIGS. 7A-7E are cross-sectional side view illustrations of a method of forming a p-n junction within an LED by selective diffusion in accordance with an embodiment.
Figure 7B:
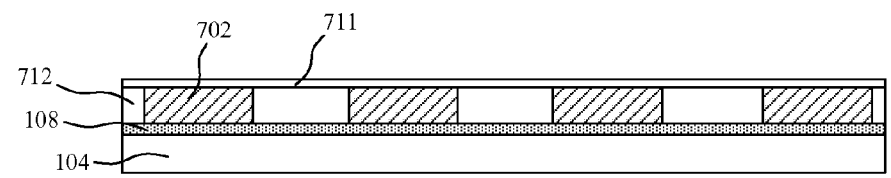
Figure 7C:
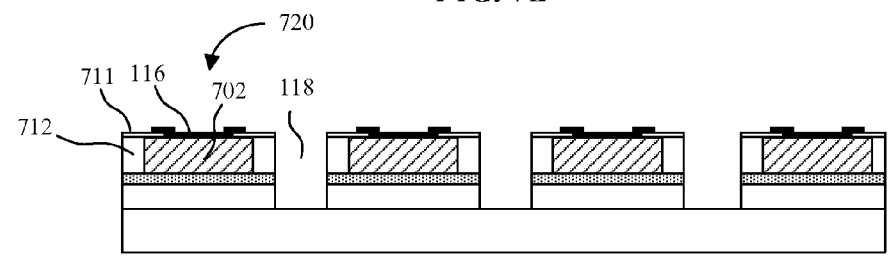
Figure 7D:
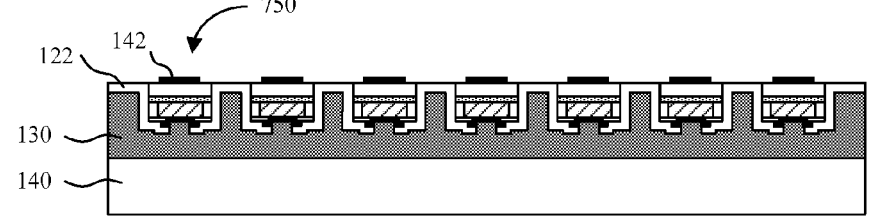
Figure 7E:
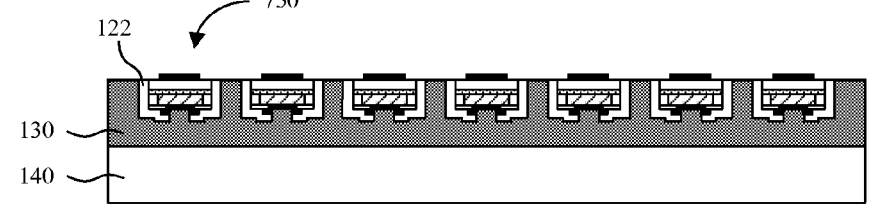

Referring FIG. 7B, p-doped region 702 is diffused into the cladding layer 710 and current spreading layer 712 as described above, stopping before the p-dopant encroaches into the active layer 108. Following the diffusion, an insulating layer 711 is formed over the epitaxial layer 715. Insulating layer 711 may be formed of a variety of materials, including SiO$_2$ and SiN$_x$. Referring now to FIG. 7C, openings are formed in the insulating layer 711, and conductive contacts 116 are formed over the openings, and trenches 118 are then etched through the insulating layer 711 and epitaxial layer 715 to form mesa structures 720. The processing sequence illustrated in FIGS. 7D-7E may then be similar to that described above with regard to FIGS. 1B-1F to form LEDs 750.

Figure 7F:
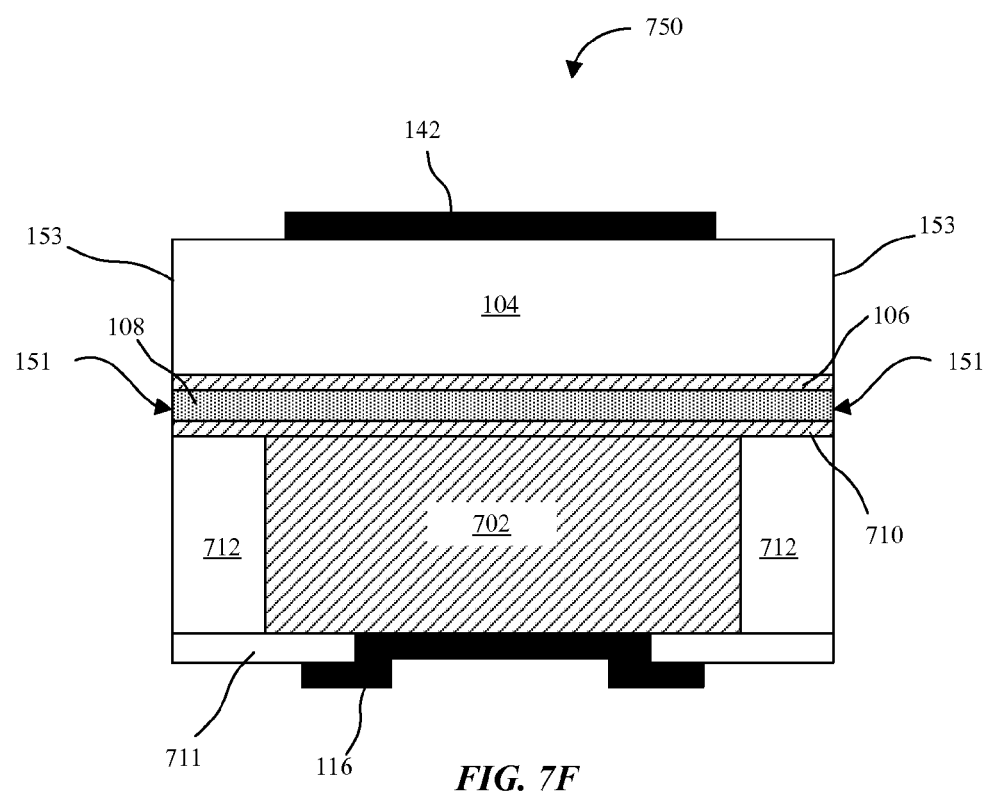
FIG. 7F is a cross-sectional side view illustration of an LED with a selectively diffused p-n junction in accordance with an embodiment.

FIG. 7F is a cross-sectional side view illustration of an LED with a selectively diffused p-n junction in accordance with an embodiment. As illustrated, the LED 750 includes an internally confined p-doped region 702 extending through (n-) doped current spreading layer 712, and (n-) doped cladding layer 710. Insulating layer 711 may optionally be formed in order to cover the junction between p-doped region 702 and (n-) doped current spreading layer 712 so that the bottom conductive contact 116 does not make contact with the (n-) doped current spreading layer 712. In the embodiment illustrated in FIG. 7F, the current injection region into the active layer 108 is confined internally within the LED by the p-doped region 702.

Figure 8A:
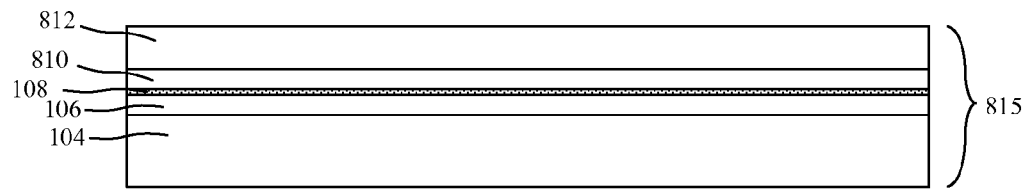
FIGS. 8A-8E are cross-sectional side view illustrations of a method of forming an LED with a diffused transverse junction in accordance with an embodiment.
Figure 8B:
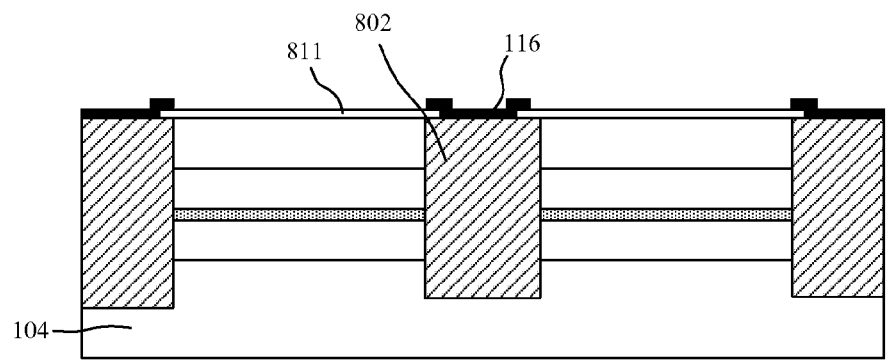
Figure 8C:
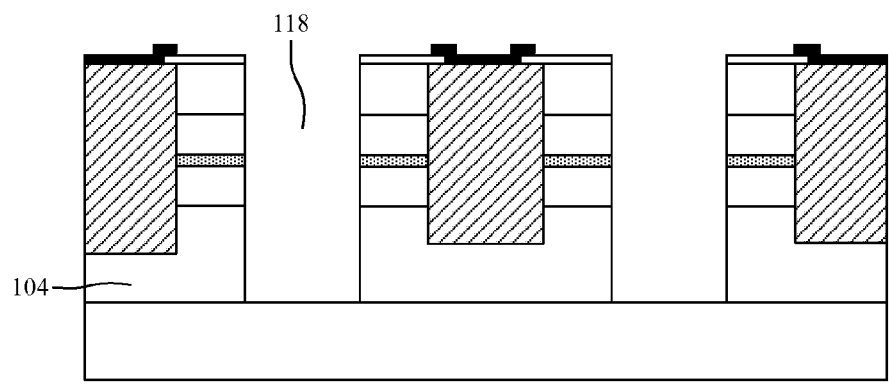
Figure 8D:
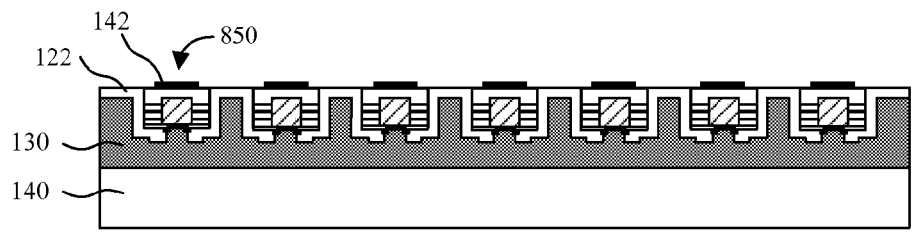
Figure 8E:
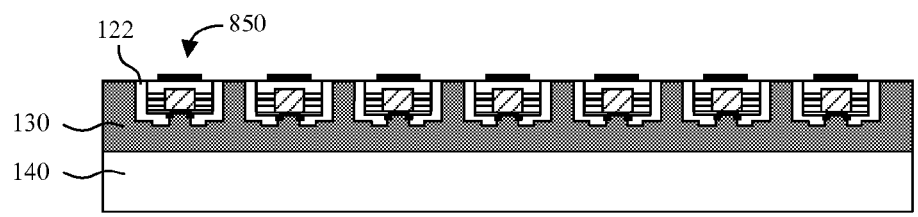

FIGS. 8A-8E are cross-sectional side view illustrations of a method of forming an LED with a diffused transverse junction in accordance with an embodiment. In an embodiment, epitaxial layer 815 illustrated in FIG. 8A is identical to the epitaxial layer 715 illustrated in FIG. 7A, with layers 810, 812 corresponding to layers 710, 712. The processing sequence illustrated in FIGS. 8A-8E is substantially similar to that illustrated in FIGS. 7A-7E with the difference being that the p-doped regions 802 are formed through layers 812, 810, 108, 106, and partially into current spreading layer 104.

Figure 8F:
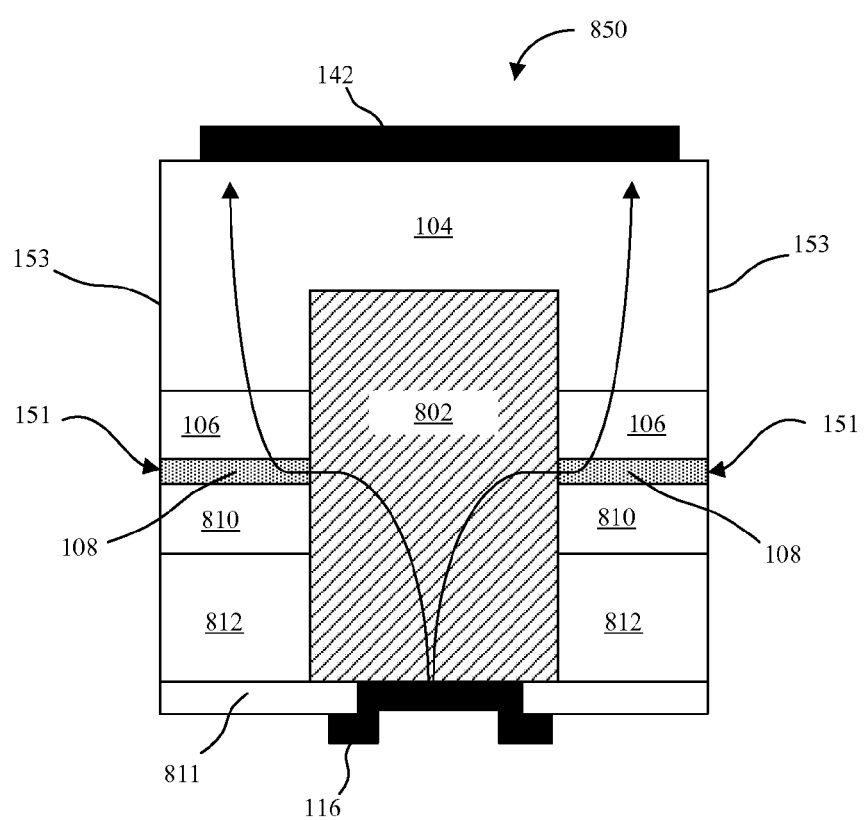
FIG. 8F is a cross-sectional side view illustration of an LED with a diffused transverse junction in accordance with an embodiment.

FIG. 8F is a cross-sectional side view illustration of an LED 850 with a diffused transverse junction in accordance with an embodiment. As illustrated, the p-n junction becomes a lateral junction formed within the active layer 108. In the embodiment illustrated in FIG. 8F, the current injection region into the active layer 108 is confined internally within the LED by the p-doped region 802. Furthermore, the p-n junction is transverse, and confined internally within the LED 850.

Figure 9A:
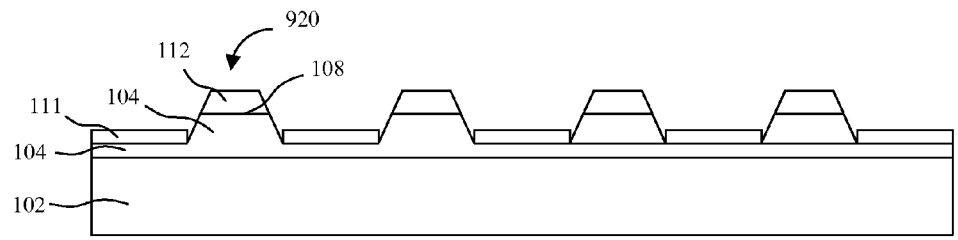
FIGS. 9A-9E are cross-sectional side view illustrations of a method of forming an LED with selective area grown and in-situ growth of a sidewall passivation layer in accordance with an embodiment.
Figure 9B:
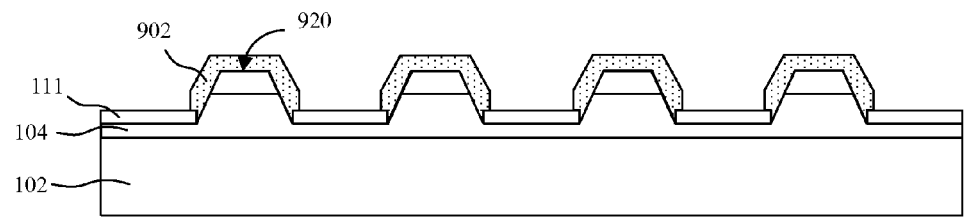
Figure 9C:
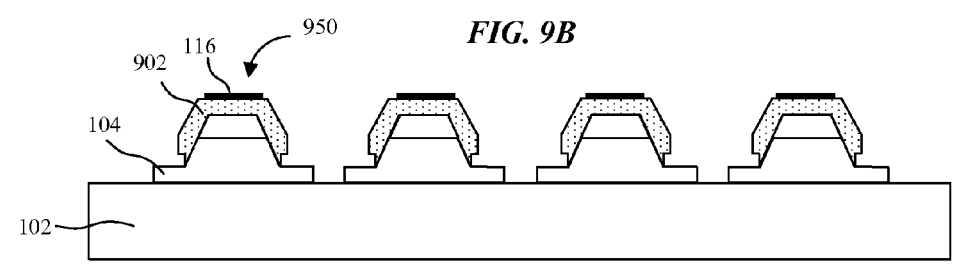
Figure 9D:
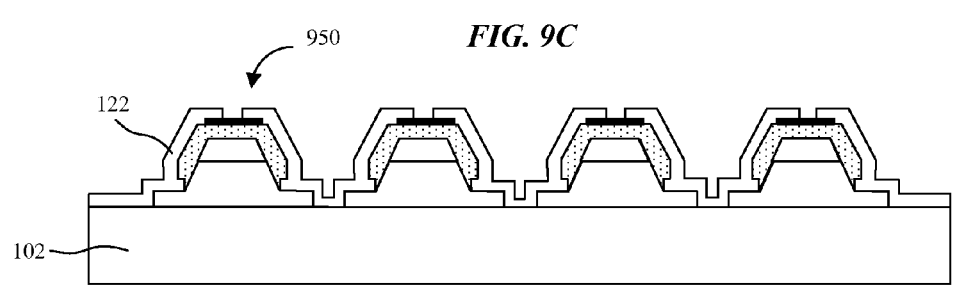
Figure 9E:
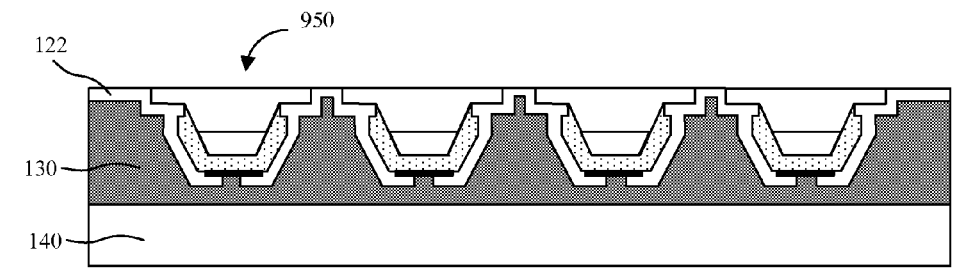

FIGS. 9A-9E are cross-sectional side view illustrations of a method of forming an LED with selective area grown and in-situ growth of a sidewall passivation layer in accordance with an embodiment. In an embodiment, the method illustrated in FIGS. 9A-9E is directed toward phosphorus based LEDs designed for emission of red light, and having a cubic crystal structure. The method illustrated in FIGS. 9A-9E may be applicable to other types of crystal structures, and may result in more complex sidewall shapes. Referring to FIG. 9A, a patterned mask layer 111 is formed over a growth substrate 102. In an embodiment, the patterned mask layer 111 is formed directly on a growth substrate 102 that will eventually be removed. In the particular embodiment illustrated, the patterned mask layer 111 is formed on a partially formed current spreading layer 104. Mesa structures 920 may then be selectively grown in the pre-defined openings within the patterned mask layer 111. Mesa structures 920 may include epitaxial layers similar to those described above with regard to p-n diode layer 115 of FIG. 1A for emission of red light. In an embodiment, selective area growth results in no-growth (111) sidewalls, on a near-(100) surface. Following the formation of mesa structures 920 including the p-n diode layer, an in-situ sidewall passivation layer 902 is grown (in-situ with growth of the mesa structures). In an embodiment, the passivation layer includes AlInP, which may be p-doped. In an embodiment, the passivation layer 902 is grown in-situ, immediately following formation of the mesa structures 920, without removing from the MOCVD reactor. The passivation layer 902 grows conformally by reducing the growth temperature to avoid evaporation or migration of the deposition species. Following the formation of the sidewall passivation layer 902, conductive contacts 116 are formed and the processing sequence may be performed similarly as described above with regard to FIGS. 1B-1F to form LEDs 950.

FIG. 9F is a cross-sectional side view along a x-direction (111) plane of a selectively grown LED with an in-situ grown sidewall passivation layer in accordance with an embodiment. FIG. 9G is a cross-sectional side view along a y-direction (111) plane of a selectively grown LED with in-situ grown sidewall passivation layer in accordance with an embodiment. As illustrated in FIGS. 9F-9G, the passivation layer 902 may be similar to that described above with regard to FIG. 5I. As illustrated, the LED 950 includes passivation layer 902 formed around the sidewalls 153 and underneath the p-n diode layer 115, and the bottom conductive contact 116 is formed on the p-doped passivation layer 902. As shown, the passivation layer 902 does not completely cover sidewalls of the n-doped current spreading layer 104, and does not reach the top surface of the p-n diode layer. In this manner, a p-n junction is created at the interface of 902-104 in which has a higher turn-on voltage than at the active layer 108, and current preferentially flows through the intended region which emits light. Additionally, in the embodiment illustrated, the passivation layer 902 laterally surrounds the active layer 108 within the LED 950 such that edges 151 of the active layer 108 are passivated by the passivation layer 902.

Figure 10A:
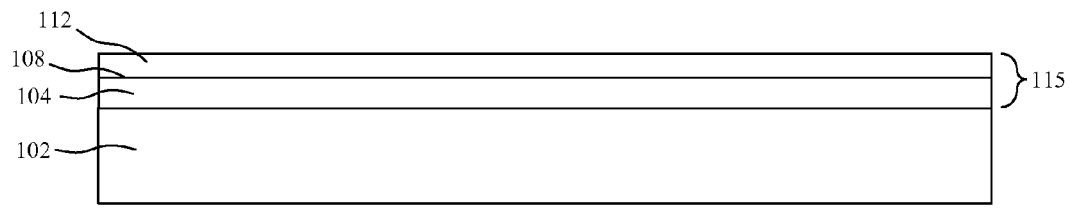
FIGS. 10A-10D are cross-sectional side view illustrations of a method of forming an LED with a regrown sidewall passivation layer in accordance with an embodiment.
Figure 10B:
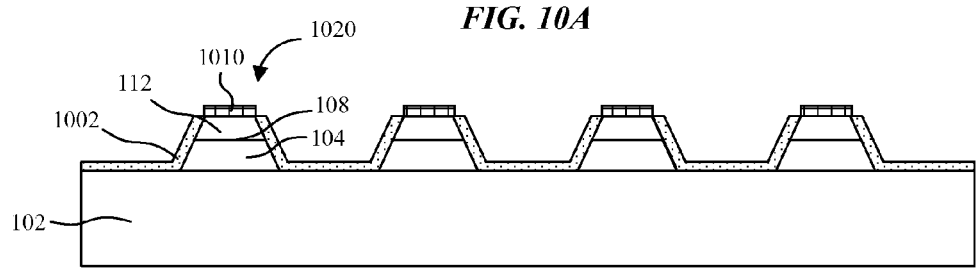
Figure 10C:
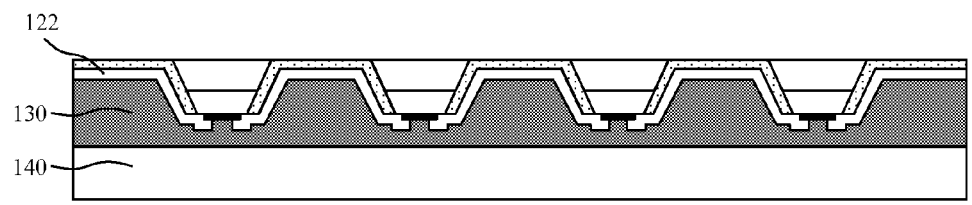
Figure 10D:
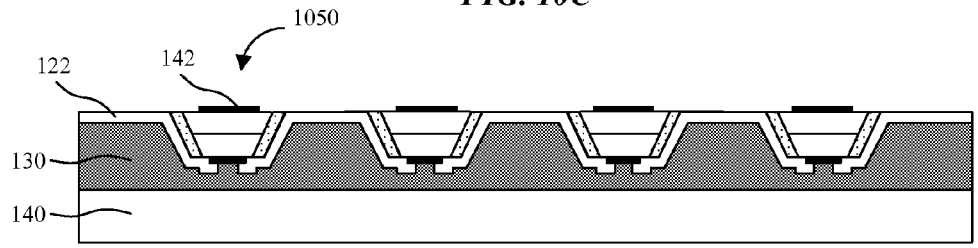

FIGS. 10A-10D are cross-sectional side view illustrations of a method of forming an LED with a regrown sidewall passivation layer in accordance with an embodiment. In an embodiment, the method illustrated in FIGS. 10A-10D is directed toward phosphorus based LEDs (e.g. AlGaInP) designed for emission of red light, and having a cubic crystal structure. Referring to FIG. 10A, a p-n diode layer 115 is formed on a growth substrate 102, similarly as described above with regard to FIG. 1A. The p-n diode layer 115 is then wet chemical etched to form (111) sidewalls. Referring to FIG. 10B, the mask layer 1010 used during the wet chemical etch may remain or be removed prior to epitaxial growth of passivation layer 1002 along the (111) sidewalls. In an embodiment, passivation layer 1002 includes GaN, which can be insulating compared to the p-n diode layer 115. Alternatively, it may be grown p-type. Because the sidewalls have a (111) crystal surface orientation, they serve as a proper seed surface for epitaxial growth of the hexagonal structure AlGaN. Thereby the quality of the regrown epitaxial interface is improved to reduce surface recombination. In another embodiment, this structure may be formed entirely in an in-situ process, where the (111) sidewall mesa structures are formed by selective growth as described with regard to FIGS. 9A-9G, then immediately passivated in-situ by epitaxial growth of insulating or p-type GaN. Referring to FIGS. 10C-10D, the mask layer 1010 is removed and the structure is processes similarly as described above with regard to FIGS. 1B-1F to form LEDs 1050.

Figure 10E:
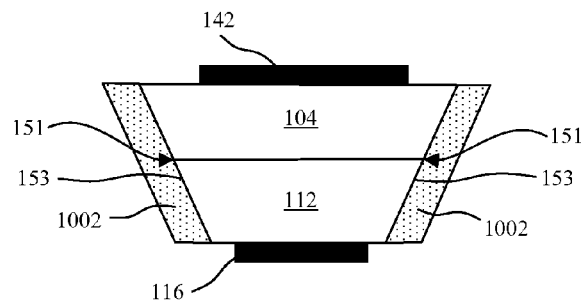
FIG. 10E is a cross-sectional side view along a x-direction (111) plane of an LED with a regrown sidewall passivation layer in accordance with an embodiment.
Figure 10F:
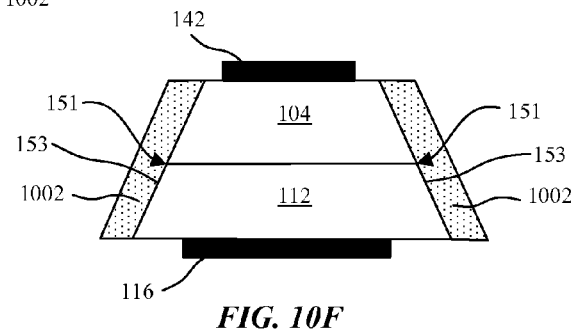
FIG. 10F is a cross-sectional side view along a y-direction (111) plane of an LED with a regrown sidewall passivation layer in accordance with an embodiment.

FIG. 10E is a cross-sectional side view along a x-direction (111) plane of an LED with a regrown sidewall passivation layer in accordance with an embodiment. FIG. 10F is a cross-sectional side view along a y-direction (111) plane of an LED with a regrown sidewall passivation layer in accordance with an embodiment. As illustrated in FIGS. 10E-10F the passivation layer 1002 is formed around the p-n diode layer sidewalls 153 (also corresponding to the LED sidewalls 151). Since the passivation layer 1002 is epitaxially grown, the bonds are satisfied at the LED sidewalls 151. In this manner, the surface recombination is minimized. Furthermore, since the LED 1050 does not include an Al-containing layer in the p-n diode layer 115, the p-n diode layer 115 can be wet etched and then transferred to a chamber for epitaxial growth without oxidation of the exposed layers after wet etching.

Figure 10G:
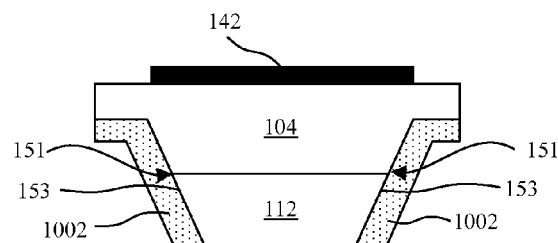
FIG. 10G is a cross-sectional side view along a x-direction (111) plane of an LED with a regrown sidewall passivation layer and wide top current spreading layer in accordance with an embodiment.
Figure 10H:
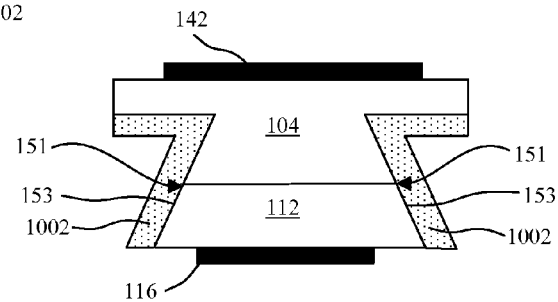
FIG. 10H is a cross-sectional side view along a y-direction (111) plane of an LED with a regrown sidewall passivation layer and wide top current spreading layer in accordance with an embodiment.

FIGS. 10G-10H are similar to FIGS. 10E-10F, with a difference being that the LEDs are patterned to include a wide top current spreading layer 104. In this manner, the top conductive contact 104 can be made larger, with less risk of making direct contact through the passivation layer 1002.

Figure 11A:
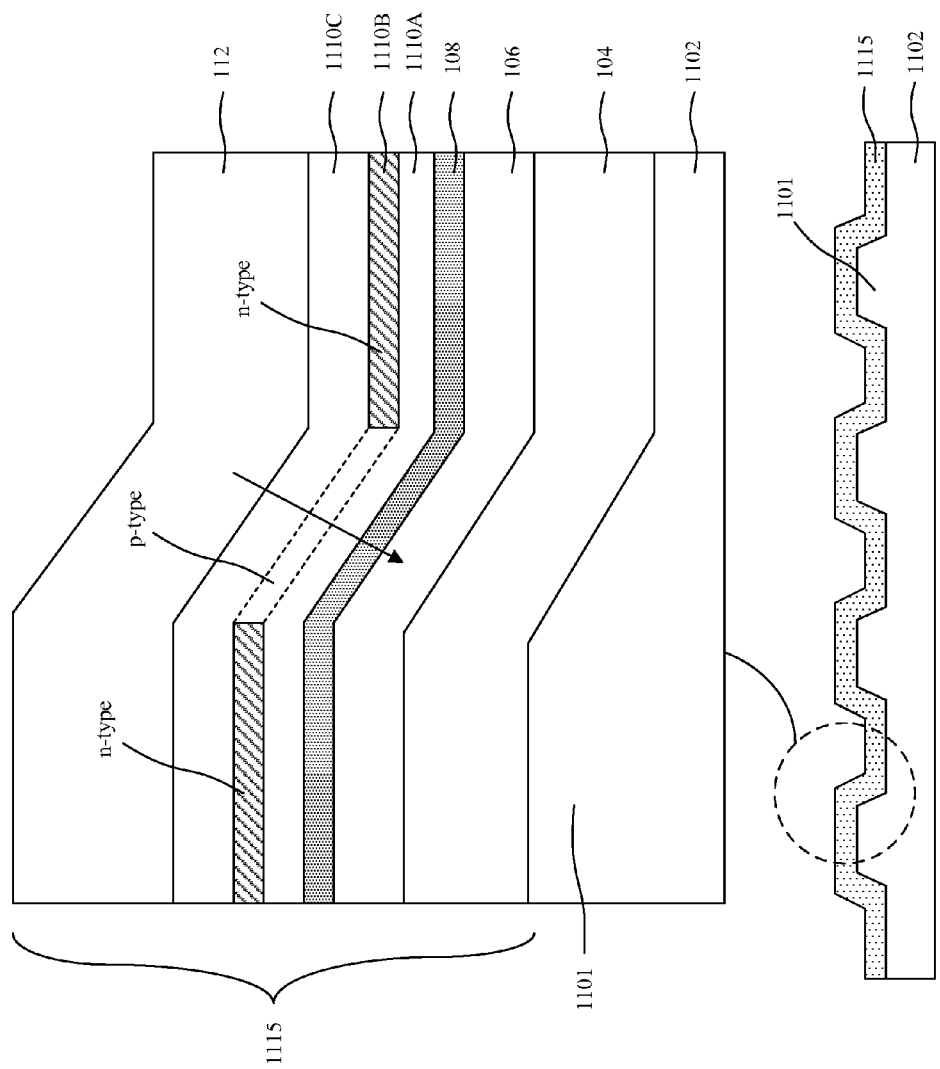
FIG. 11A is a close up cross-sectional view of a p-n diode layer formed on a patterned substrate and including orientation dependent doping in accordance with an embodiment.

Referring now to FIGS. 11A-11D, cross-sectional side view illustrations are provided for a method of forming an LED p-n junction with orientation dependent doping in accordance with an embodiment. FIG. 11A is a close up cross-sectional view of a p-n diode layer formed on a patterned substrate and including orientation dependent doping in accordance with an embodiment. In an embodiment, the method illustrated in FIGS. 11A-11D is directed toward phosphorus based LEDs designed for emission of red light. As shown in FIG. 11A, a growth substrate 1102, such as (100) GaAs substrate is formed with etched steps 1101. A p-n diode layer 1115 is then epitaxially grown on the patterned growth substrate 1102. In an embodiment, the p-n diode layer includes n-AlInP current spreading layer 104, n-AlInGaP:Se or Si cladding layer 106, InGaP active layer 108, p-AlInGaP:Mg cladding layer 1110A, co-doped AlGaInP:Mg+Se cladding layer 1110B, p-AlInGaP:Mg cladding layer 1110C, and p-GaP current spreading layer 112.

Figure 11B:
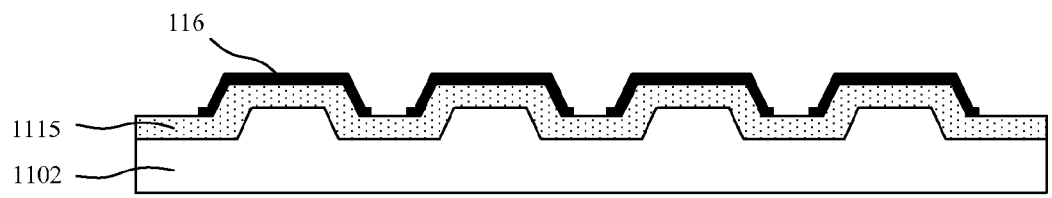
FIGS. 11B-11D are cross-sectional side view illustrations of a method of forming an LED p-n junction with orientation dependent doping in accordance with an embodiment.
Figure 11C:
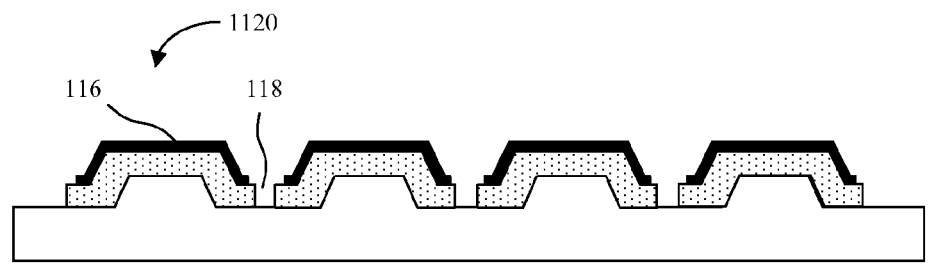
Figure 11D:
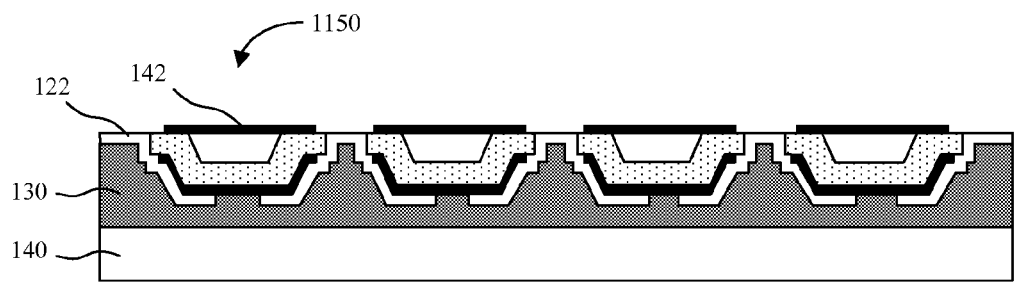

Specifically, the particular method of forming the cladding layers 1110A-C, and particularly cladding layer 1110B implements orientation-dependence of n, p doping within the cladding layer 1110B. Specifically, an n-type cladding layer 1110B is formed on the (100) planar surfaces, and a net p-type cladding layer 1110B is formed along the sloped regions. Thus, Se is incorporated within the AlGaInP cladding layer 1110B at (100) orientation, while Mg is preferentially incorporated within the AlGaInP cladding layer 1110B along the misoriented slope resulting in p-n diode layer 1115 in which the p-n junction is located on the sloped sidewalls, while n-p-n-p junctions are formed on the (100) surface. Thus, the current injection path preferentially (illustrated as an arrow in FIG. 11A) flows through the p-n junction formed on the sloped sidewalls. Referring now to FIGS. 11B-11D, the processing sequence is similar to that described above with regard to FIGS. 1B-1F to form LEDs 1150.

Figure 11E:
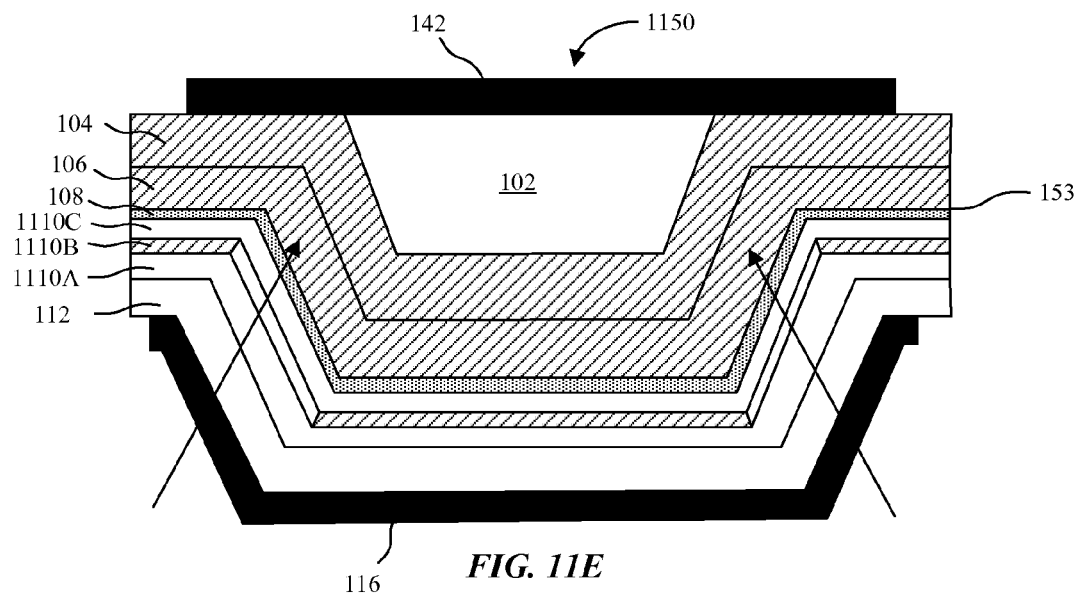
FIGS. 11E-11F are cross-sectional side view illustrations of LED p-n junctions with orientation dependent doping in accordance with embodiments.
Figure 11F:
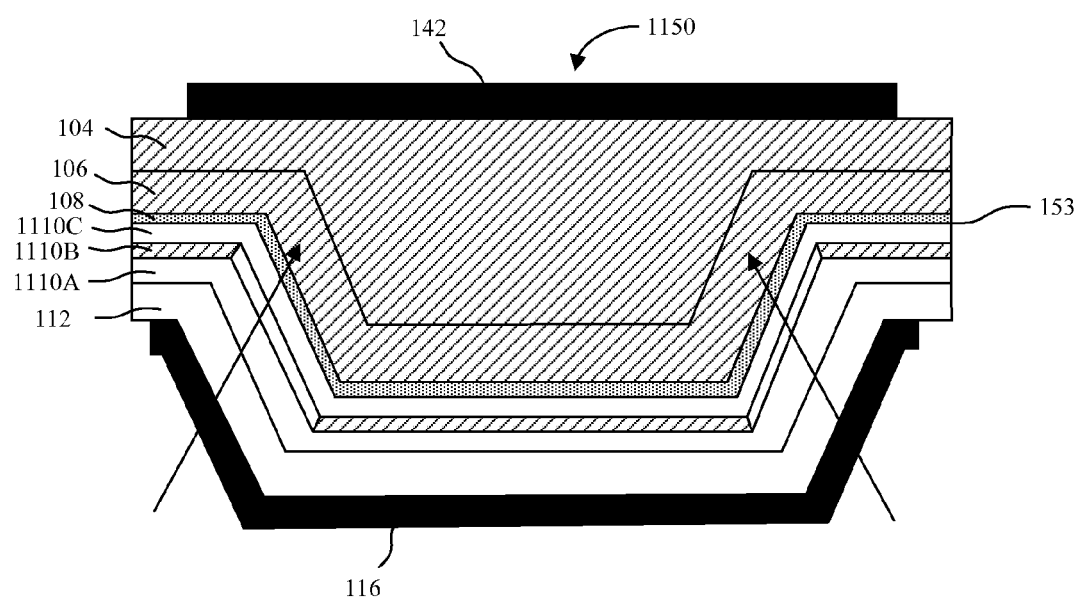

FIGS. 11E-11F are cross-sectional side view illustrations of LED p-n junctions with orientation dependent doping in accordance with embodiments. As illustrated in FIGS. 11E-11F, the p-n junction, and current injection paths (illustrated as arrows in FIGS. 11E-11F) are located internally within the LED 1150 away from the active layer 108 edges along sidewalls 153 of the p-n diode layer. In the embodiment illustrated in FIG. 11E, a portion of the growth substrate 102 is left behind within the resultant LED 1150. In the embodiment illustrated in FIG. 11F, thickness of the p-n diode layer 1115 is sufficient enough to fill the internal portion of the LED 1150. For example, current spreading layer 104 may fill the interior portion of the LED 1150.

Figure 12A:
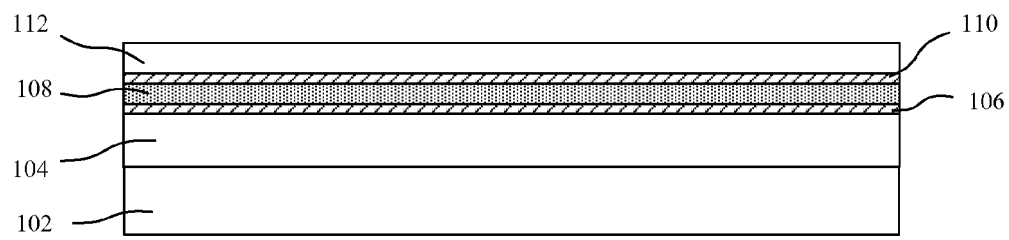
FIGS. 12A-12F are cross-sectional side view illustrations of a method of forming an LED with selective etching and mass transport in accordance with an embodiment.

FIGS. 12A-12F are cross-sectional side view illustrations of a method of forming an LED with selective etching and mass transport in accordance with an embodiment. Referring to FIG. 12A, a p-n diode layer 115 is formed on a growth substrate 102, similarly as described above with regard to FIG. 1A. The p-n diode layer 115 may be designed for red, green, or blue emission. Though, the particular processing sequence may depend upon whether the p-n diode layer 115 nitride based or phosphorus based.

Figure 12B:
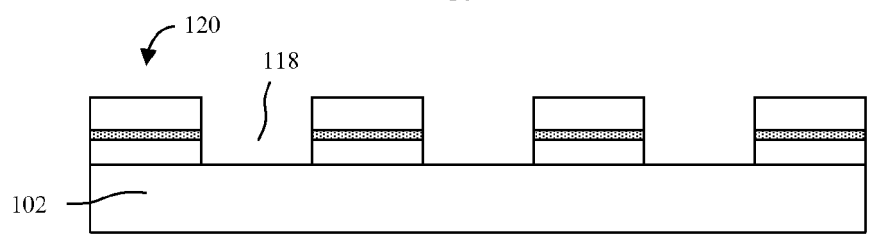
Figure 12C:
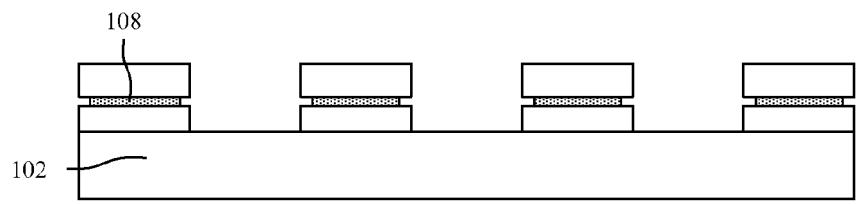
Figure 12D:
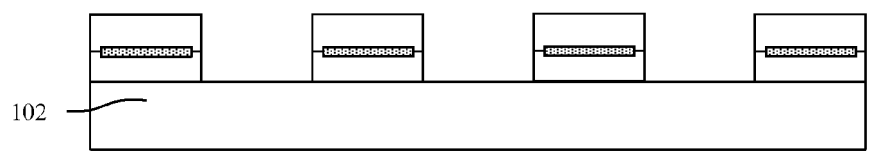
Figure 12E:
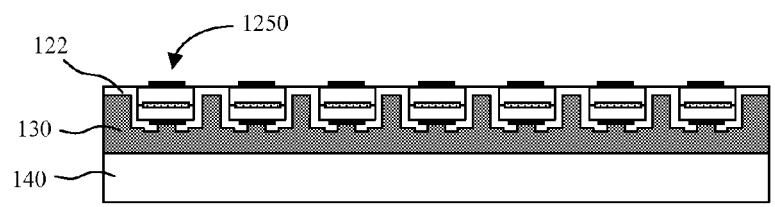
Figure 12F:
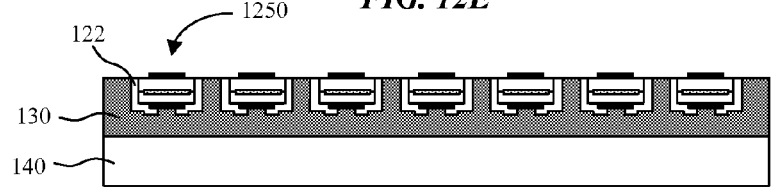

Referring now to FIG. 12B, trenches 118 are formed through the p-n diode layer 115 to form mesa structures 120 as previously described. In an embodiment, the p-n diode layer 115 is phosphorus based, and a selective etch of an InGaP active layer 108 is performed to create a notch in the active layer as illustrated in FIG. 12C. In an embodiment, the p-n diode layer 115 is nitride based, and a light activated (e.g. between 365 and 450 nm) photo-electrochemical etch selectively removes a portion of an InGaN active layer 108 to produce a notch. Referring now to FIG. 12D, mass-transport at high temperatures causes mass-transport of the adjacent materials to form a new p-n junction that envelops the notched active layer 108. It is contemplated that mass-transport may possibly envelop the edges of the active layer 108 without first forming a notch. In an embodiment in which the p-n diode layer 115 is phosphorus based, mass transport is caused by exposure to $PH_3+H_2$ at high temperature. In such an embodiment the adjacent p-AlInGaP cladding layer 110 and n-AlInGaP cladding layer 106 envelope the InGaP active layer 108. In an embodiment in which the p-n diode layer 115 is nitride based, mass transport is caused by exposure to $NH_3+H_2$ at high temperature. In such an embodiment the adjacent p-GaN current spreading layer 112 and n-GaN current spreading layer 104 envelope the InGaN active layer 108. Referring to FIGS. 12E-12F, the structure may then be processed similarly as described above with regard to FIGS. 1B-1F to form LEDs 1250.

Figure 12G:
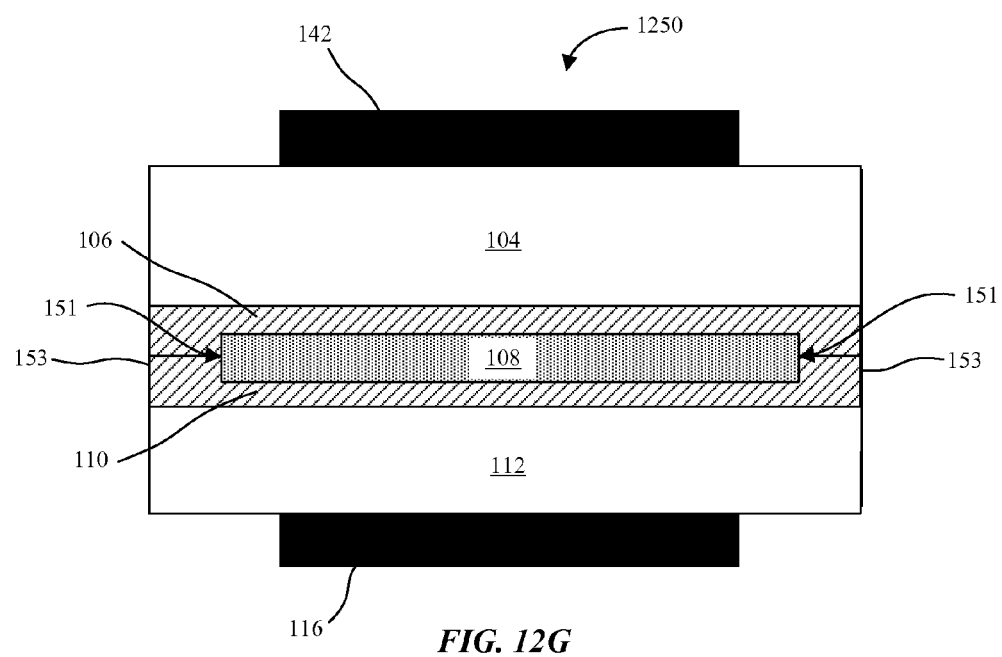
FIGS. 12G-12H are cross-sectional side view illustrations of LEDs including a notched active layer in accordance with an embodiment.
Figure 12H:
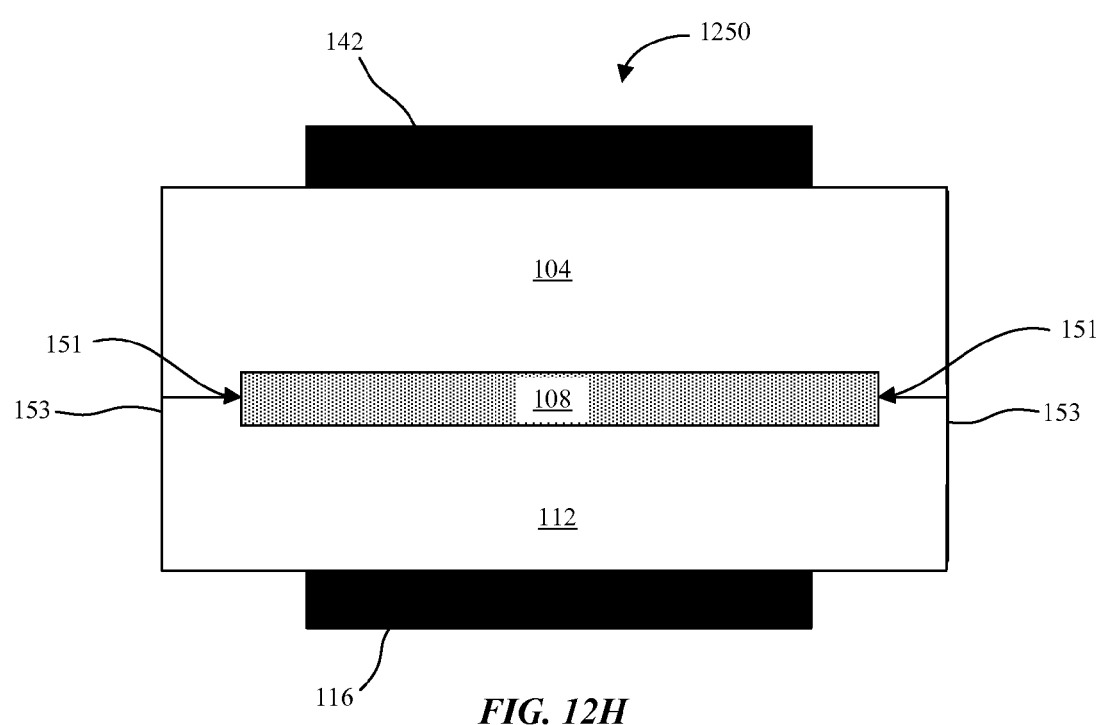

FIGS. 12G-12H are cross-sectional side view illustrations of LEDs including a notched active layer in accordance with an embodiment. As illustrated in FIG. 12G, the adjacent p-AlInGaP cladding layer 110 and n-AlInGaP cladding layer 106 envelope the InGaP active layer 108. As illustrated in FIG. 12H, the adjacent p-GaN current spreading layer 112 and n-GaN current spreading layer 104 envelope the InGaN active layer 108. In each embodiment, the edges 151 of the active layer 108 are internally confined within the LED 1250, inside of the p-n diode layer sidewalls 153.

Figure 13A:
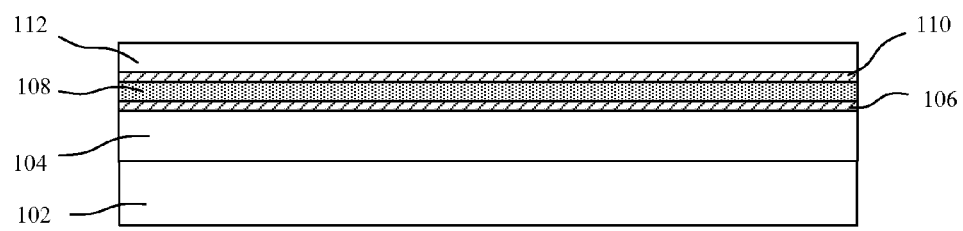
FIGS. 13A-13C are cross-sectional side view illustrations of a method of passivating the sidewalls of an LED with surface conversion in accordance with an embodiment.
Figure 13B:
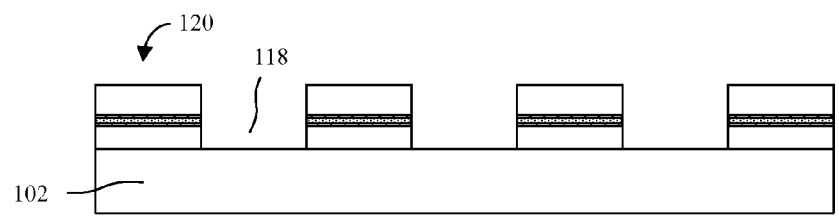
Figure 13C:
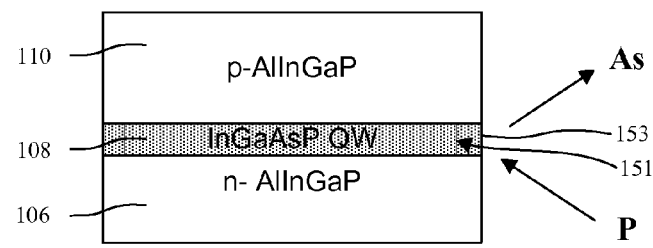

FIGS. 13A-13C are cross-sectional side view illustrations of a method of passivating the sidewalls of an LED with surface conversion in accordance with an embodiment. FIGS. 13A-13B are substantially similar to FIGS. 12A-12B for a phosphorus based p-n diode structure, with a slight difference in composition. Referring to FIG. 13C the active layer 108, and optionally the cladding layers 106, 110 include arsenic in their alloys. In an embodiment, aluminum may additionally be included in the layers 106, 108, 110 to restore the bandgap value. The mesa structures 120 are exposed to $PH_3+H_2$ vapor at high temperature, which results in incongruent sublimation in which the group V species evaporate. The escaping As species is replaced by P, and the surface bandgap energy is raised. As a result, the edges 151 of the active layer 108 become internally confined within the LED, inside of the p-n diode layer sidewalls 153.

Figure 14A:
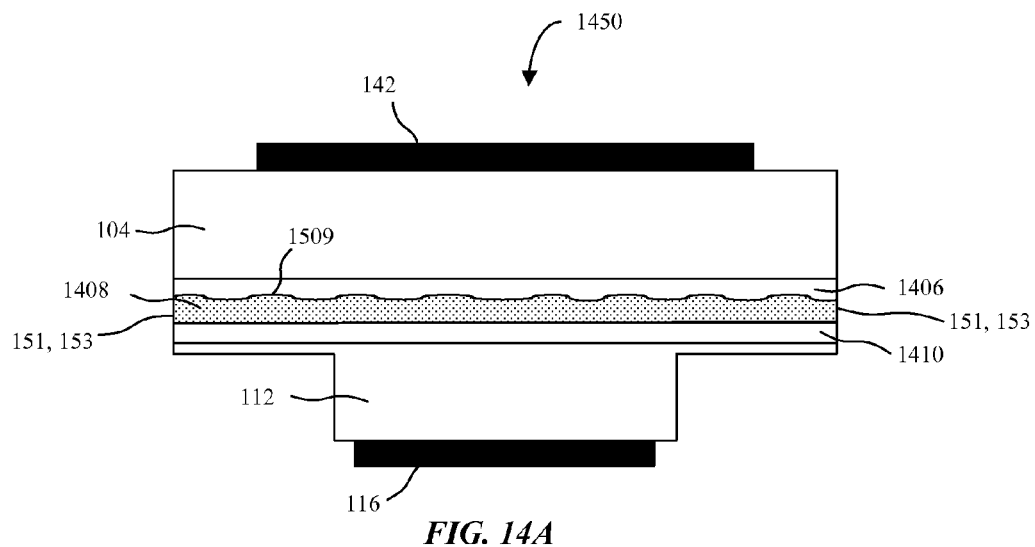
FIG. 14A is cross-sectional side view illustration of an LED with quantum dots in the active layer in accordance with an embodiment.
Figure 14B:
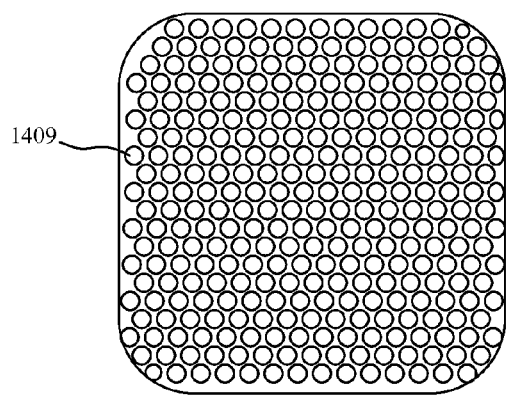
FIG. 14B is schematic top view illustration of an LED active layer with quantum dots in accordance with an embodiment.

FIG. 14A is cross-sectional side view illustration of an LED with quantum dots in the active layer in accordance with an embodiment. In an embodiment, the structure illustrated in FIG. 14A is directed toward phosphorus based LEDs designed for emission of red light. In an embodiment, an LED 1450 includes a quantum dot active region 1408 in which injected carriers are localized at the quantum dots and less likely to diffuse to the LED sidewalls 151. FIG. 14B is schematic top view illustration of an LED active layer with quantum dots 1409 in accordance with an embodiment. In an embodiment, cladding layer 1410 is formed of p-AlInP, cladding layer 1406 is formed of n-AlInP, and active layer 108 is formed of (Al)GaInP. During formation of the layers, deposition is controlled such that compressive strain causes segregation of In into In-rich areas. Deposition conditions can also be controlled to take advantage of the miscibility gap to form In-rich areas. In this manner, the In-rich quantum dot clumps, with lower band gaps, trap the carriers and suppress lateral diffusion to the LED sidewalls 151. Detection of the quantum dot clumps in the non-homogenous active layer 108 may be detected by, for example, photoluminescence. Exemplary, quantum dot clumps 1409 depends upon the lens scale over which low band gap regions are formed, and may be on the order of 10-20 nm in an embodiment.

Figure 15A:
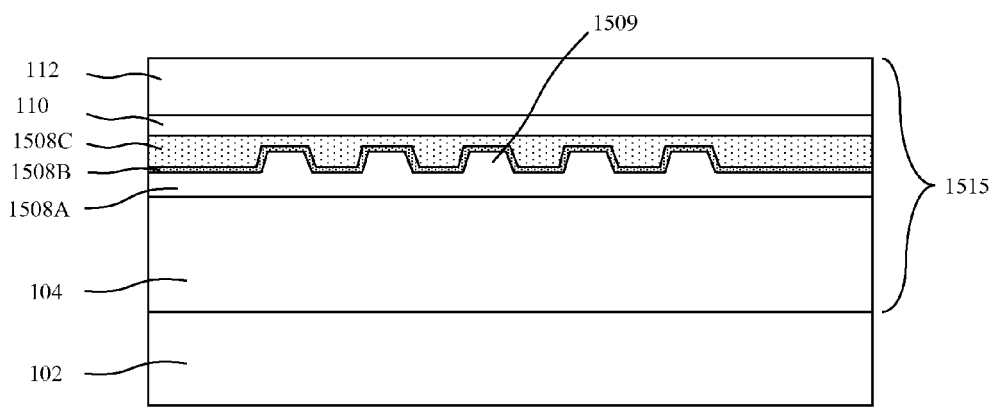
FIGS. 15A-15C are cross-sectional side view illustrations of a method of forming an LED with nanopillars in the active layer in accordance with an embodiment.
Figure 15B:
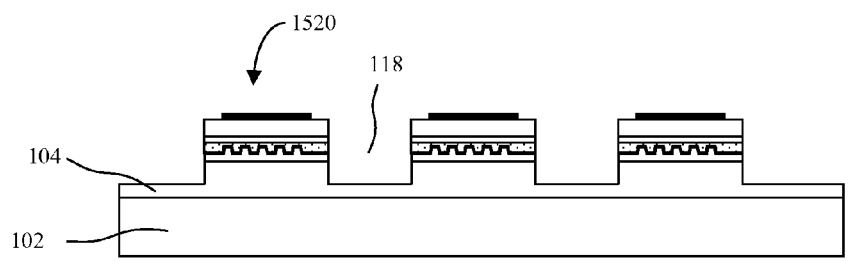
Figure 15C:
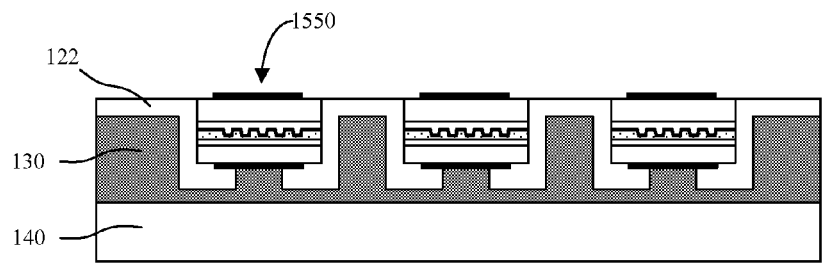
Figure 15D:
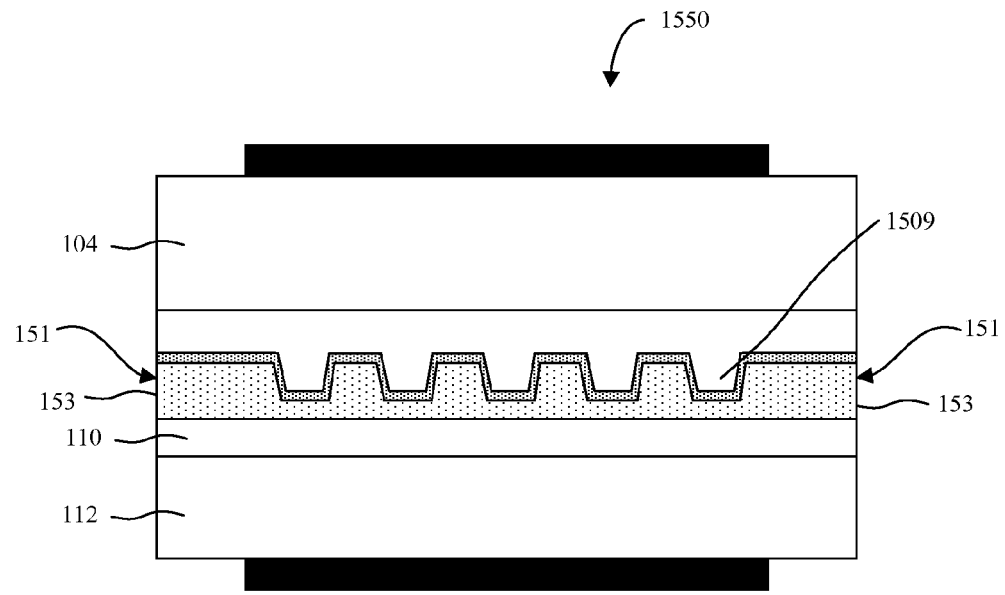
FIG. 15D is cross-sectional side view illustration of an LED with nanopillars in the active layer in accordance with an embodiment.
Figure 15E:
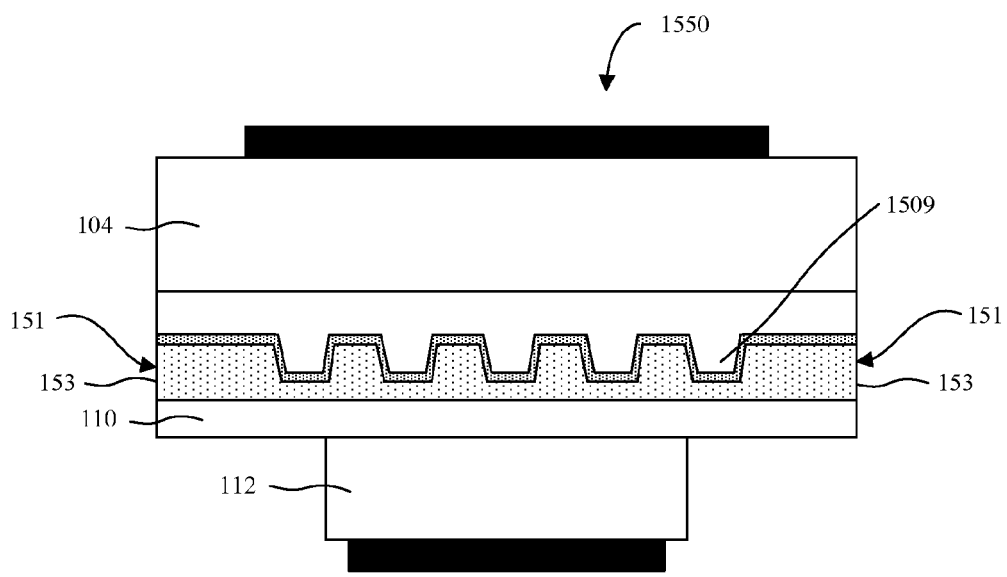
FIG. 15E is cross-sectional side view illustration of an LED with nanopillars in the active layer and a top hat configuration in accordance with an embodiment.

FIGS. 15A-15C are cross-sectional side view illustrations of a method of forming an LED with nanopillars in the active layer in accordance with an embodiment. In an embodiment, the structure illustrated in FIG. 15A is directed toward nitride based LEDs designed for emission of green or blue light. In an embodiment, p-n diode layer 1515 includes a n-GaN current spreading layer 104, p-AlGaN cladding layer 110, and p-GaN current spreading layer 112. Multiple layers may form the active layer. In an embodiment, multiple active layers include InGaN. In an embodiment, a first $In_1GaN$ active layer 1508A includes a plurality of nanopillars 1509. The nanopillars 1509 can be formed spontaneously by compressive strain in the $In_1GaN$ active layer 1508A. In an embodiment, the nanopillars 1509 are formed by selective growth, or patterning. After forming the first $In_1GaN$ active layer 1508A, a second $In_2GaN$ active layer 1508B is formed with higher indium content than in the first $In_1GaN$ active layer 1508A. As a result, a larger concentration of indium may be located on the quantum dots, or nanopillars 1509. The indium segregation may additionally increase the size of the nanopillars 1509. Following the formation of the second $In_2GaN$ active layer 1508B and third $In_3GaN$ active layer 1508C is grown over and buries the quantum dots, or nanopillars 1509. In an embodiment, the indium content in $In_3GaN$ active layer 1508C is less than the indium content in $In_2GaN$ active layer 1508B, and may be the same as with $In_1GaN$ active layer 1508A. Referring to FIGS. 15B-15C, the structure may be processed similarly as described above with regard to FIGS. 1B-1F to form LEDs 1550. FIG. 15D is cross-sectional side view illustration of an LED with nanopillars in the active layer in accordance with an embodiment. FIG. 15E is cross-sectional side view illustration of an LED with nanopillars in the active layer and a top hat configuration in accordance with an embodiment. As illustrated the bottom p-doped current spreading layer 112 is formed in a pillar formation. In the embodiments illustrated, the LEDs 1550 include quantum dots, or nanopillars 1509 within the active region 1508 in which injected carriers are localized at and less likely to diffuse to the LED sidewalls 151, which also correspond to the p-n diode layer sidewalls 153.

Figure 16A:
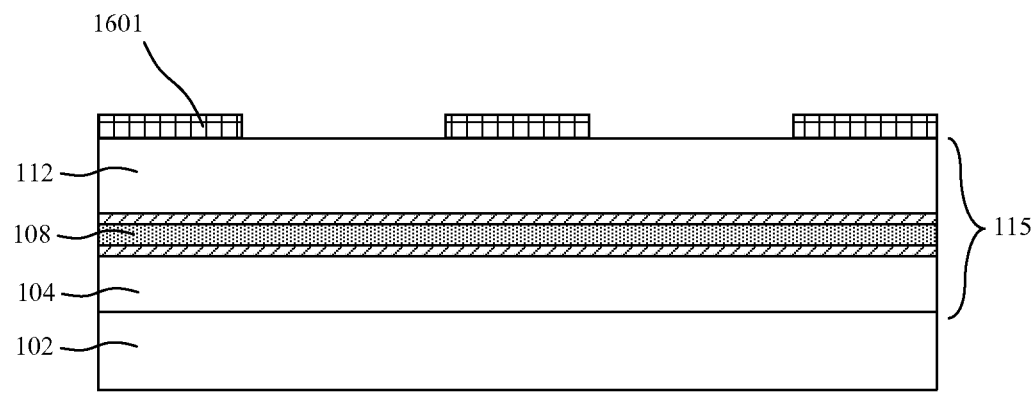
FIGS. 16A-16D are cross-sectional side view illustrations of a method of forming an LED with heterostructure intermixing at the p-n diode layer sidewalls in accordance with an embodiment.
Figure 16B:
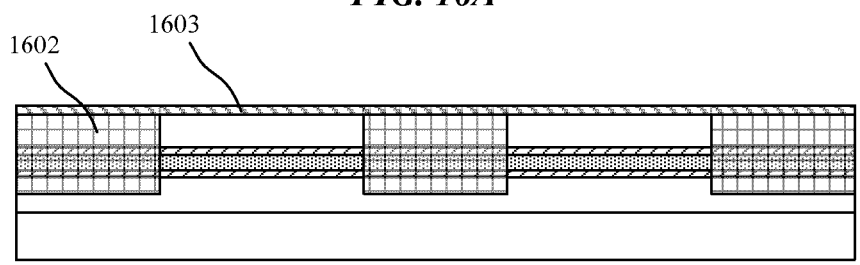

FIGS. 16A-16D are cross-sectional side view illustrations of a method of forming an LED with heterostructure intermixing at the p-n diode layer sidewalls in accordance with an embodiment. In an embodiment, the structure illustrated in FIG. 16A is directed toward phosphorus based LEDs designed for emission of red light, and may include a p-n diode layer 115 similar as with described above with regard to FIG. 1A. Still referring to FIG. 16A, injection masks 1601 are formed over the current spreading layer 112. A thermal operation is then performed to cause diffusion or intermixing, depending upon the material of the injection masks 1601. In an embodiment, the injection masks 1601 are formed of silicon. In such an embodiment, silicon diffuses from the surface to form an intermixed region 1602. Diffusion of silicon causes group III vacancies, which enable group III atoms (Al, Ga, In) to exchange lattice positions on the group III sublattice to form a homogeneous alloy across layers 106 (originally AlInGaP), 108 (originally InGaP), 110

(originally AlGaInP). Still referring to FIG. 16B, after silicon diffusion, a blanket Zn-donor layer is optionally formed over current spreading layer 112 and diffused into the surface to form p-doped layer 1603 across the surface, particularly where silicon (n-dopant) was diffused.

Figure 16C:
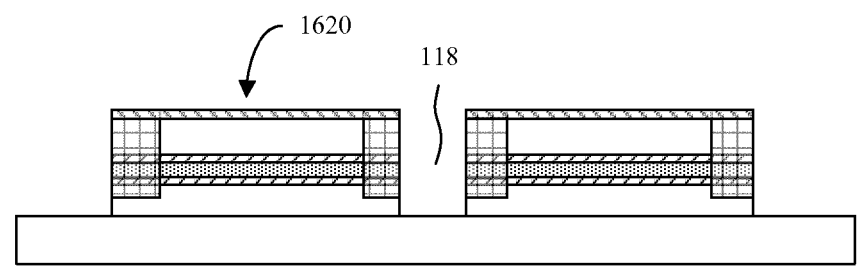
Figure 16D:
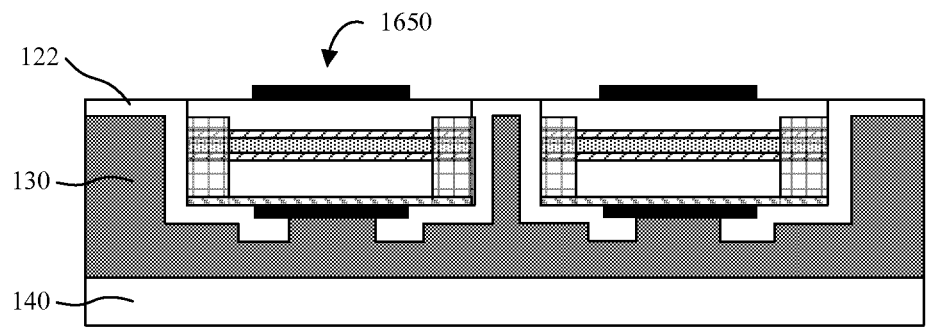
Figure 16E:
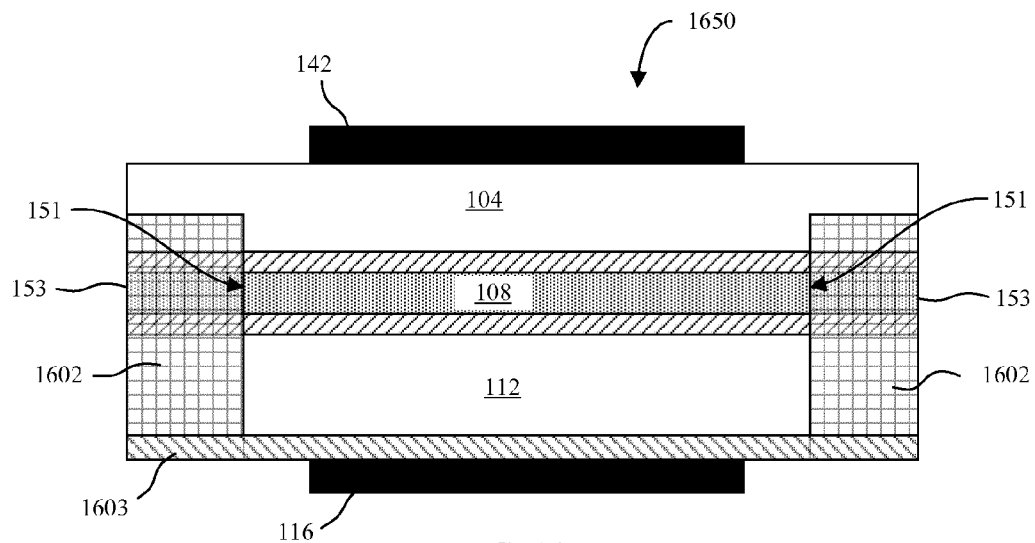
FIG. 16E is cross-sectional side view illustration of an intermixed LED heterostructure in accordance with an embodiment.

Referring now to FIGS. 16C-16D, trenches 118 are etched through the p-n diode layer 115 and the structure is patterned similarly as described above with regard to FIGS. 1B-11F to form LEDs 1650. FIG. 16E is cross-sectional side view illustration of an intermixed LED heterostructure in accordance with an embodiment. As shown the intermixed regions 1602 are formed adjacent the active layer 108 such that the edges 151 of the active layer 108 are internally confined within the p-n diode layer sidewalls 153.

In another embodiment, the injection masks 1601 are formed of $SiO_2$, which inject group III vacancies into the underlying material. In such an embodiment, Al, Ga, In diffuse into the $SiO_2$ to form the intermixed region 1602 were Al, Ga, and In are intermixed. In such an embodiment, since an n-dopant is not being diffused into the substrate, it may not be necessary to form p-doped layer 1603.

Figure 16F:
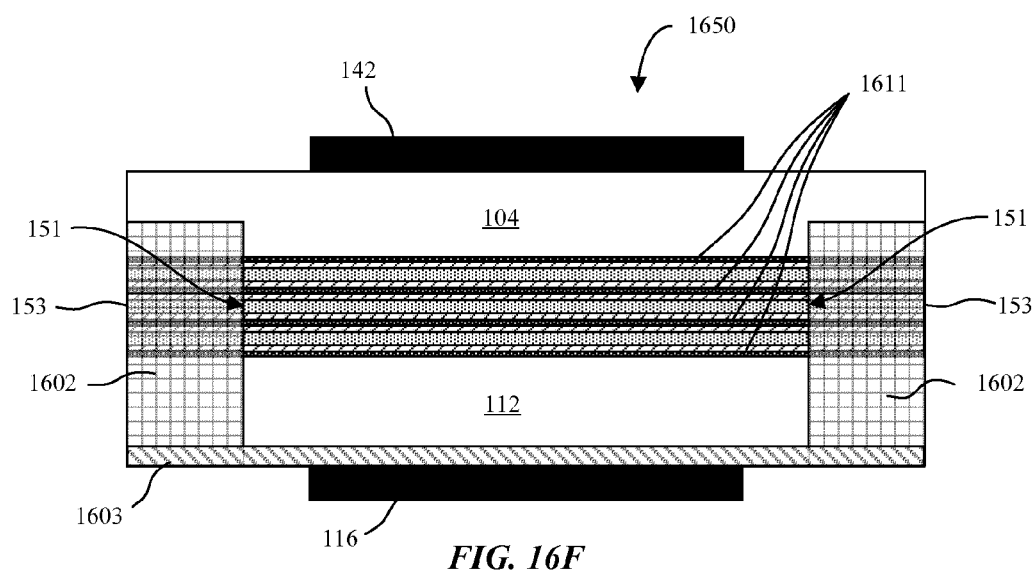
FIG. 16F is cross-sectional side view illustration of an intermixed LED heterostructure and quantum well dopant layers in accordance with an embodiment.

In another embodiment illustrated in FIG. 16F, injection masks 1601 are formed of $SiO_2$, and Si doping layers 1611 are formed in the vicinity of the one or more active layers 108. The Si doping layers 1611 may function to accelerate the intermixing in the vicinity of the active layers 108.

In accordance with embodiments, the array of LEDs may then be transferred from the carrier substrate to a receiving substrate, such as a lighting or display substrate. In an embodiment, the transfer may be accomplished by selective removal of the sacrificial release layer, for example by vapor HF etch followed by electrostatic transfer of the array of LEDs using a transfer tool including an array of electrostatic transfer heads.

Figure 17A:
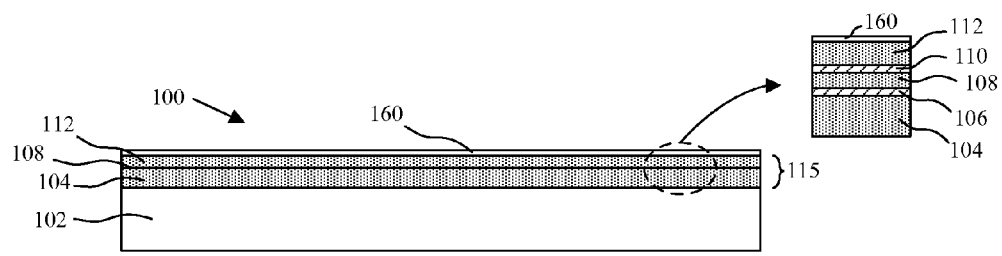
FIGS. 17A-17F are cross-sectional side view illustrations of a method of forming an LED with a sidewall passivation layer in accordance with an embodiment.
Figure 17B:
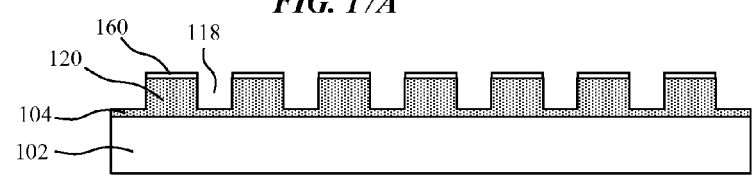

FIGS. 17A-17F are cross-sectional side view illustrations of a method of forming an LED with a sidewall passivation layer in accordance with an embodiment. Referring to FIG. 17A, a bulk LED substrate 100 is illustrated, similarly as previously described above with regard to FIG. 1A. In addition, a conductive oxide layer 160, such as ITO, may be formed over the p-n diode layer 115. For example, the conductive oxide layer 160 may make ohmic contact with a current spreading layer (e.g. 112) or cladding layer (e.g. 110) of the p-n diode layer 115. The conductive oxide layer 160 and p-n diode layer 115 may then be patterned to form trenches 118, as illustrated in FIG. 17B. Following the formation of trenches 118, the substrate may be conditioned. For example, this may include an acid dip to remove native oxide or residual contamination in an HCl or bromine based mixture. Then an in-situ plasma treatment may optionally be performed, for example using argon, hydrogen, or nitrogen.

Figure 17C:
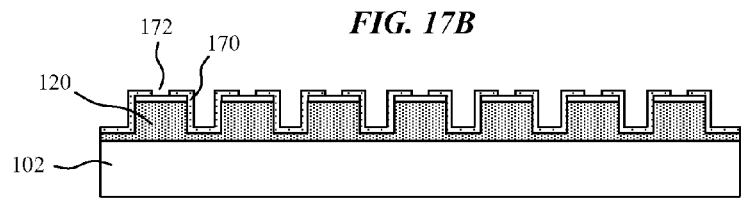

Referring now to FIG. 17C, a sidewall passivation layer 170 is formed over and between the mesa structures 120. In an embodiment, sidewall passivation layer 170 is formed using atomic layer deposition (ALD), For example, sidewall passivation layer may 170 be $Al_2O_3$, though other materials may be used. In an embodiment, sidewall passivation layer 170 is between 0-1,000 nm thick, such as 1-100 nm thick, and may have a uniform thickness that conforms the underlying substrate topography, and forms an outline around the mesa structures 120. The sidewall passivation layer 170 may then be patterned to form openings 172 over the mesa structures 120 that expose the patterned conductive oxide layer 160. For example, this may be accomplished using a fluorine based dry etching technique.

Figure 17D:
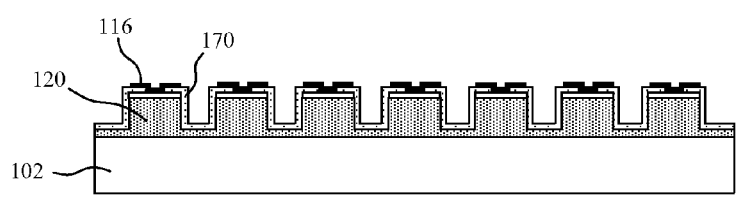
Figure 17E:
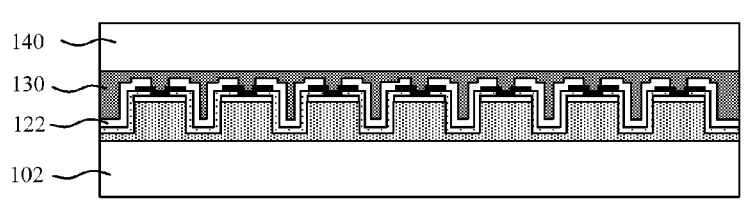
Figure 17F:
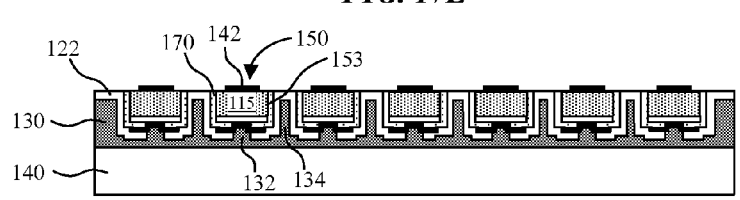

Bottom conductive contacts 116 may then be formed on the exposed portions of conductive oxide layers 160 within openings 172 as illustrated in FIG. 17D. Referring to FIG. 17E, a patterned sacrificial oxide layer 122 is formed, and the patterned structure is bonded to a carrier substrate 140 with an adhesive bonding material to form stabilization layer 130. After bonding to the carrier substrate 140, the growth substrate 102 may be removed utilizing a suitable technique such as laser lift-off, etching, or grinding to expose the p-n diode layer 115. Any remaining portions of the p-n diode layer 115 connecting the separate mesa structures 120 may then be removed using etching or grinding to form laterally separate p-n diode layers 115. A top conductive contact layer 142 may then be formed over each laterally separate p-n diode layer resulting LEDs 150 as illustrated in FIG. 17F. As shown, the ALD sidewall passivation layer 170 spans along the p-n diode layer 115 sidewalls 153 (e.g. including the top current spreading layer 104, the active layer 108, and the bottom current spreading layer 112), as well as underneath the conductive oxide layer 160.

Figure 18A:
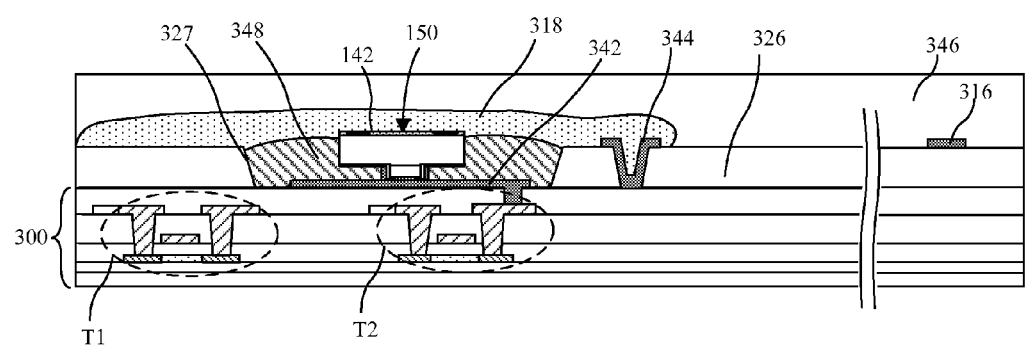
FIG. 18A is a side-view illustration of LEDs integrated into a display panel with embedded circuits in accordance with an embodiment.
Figure 18B:
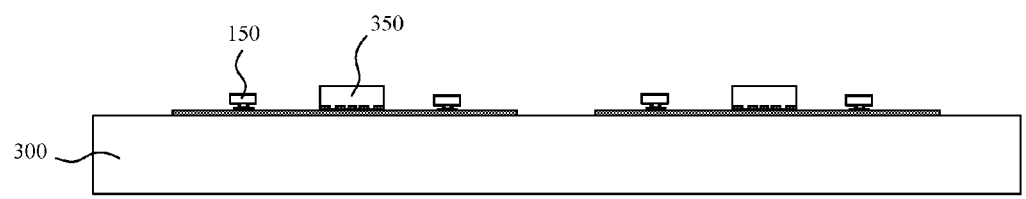
FIG. 18B is a side-view illustration of LEDs integrated into a display panel with micro chips in accordance with an embodiment.

Referring now to FIG. 18A, in an embodiment, an array of LEDs 150 is transferred and bonded to a display substrate. While LEDs 150 are illustrated, this is exemplary, and any of the above described LEDs may be used. For example, the display substrate 300 may be a thin film transistor (TFT) display substrate (i.e. backplane) similar to those used in active matrix OLED display panels. FIG. 18A is a side-view illustration of a display panel in accordance with an embodiment. In such an embodiment, the display substrate is a TFT substrate including working circuitry (e.g. transistors, capacitors, etc.) to independently drive each subpixel. Substrate 300 may include a non-pixel area and a pixel area (e.g. display area) including subpixels arranged into pixels. The non-pixel area may include a data driver circuit connected to a data line of each subpixel to enable data signals (Vdata) to be transmitted to the subpixels, a scan driver circuit connected to scan lines of the subpixels to enable scan signals (Vscan) to be transmitted to the subpixels, a power supply line to transmit a power signal (Vdd) to the TFTs, and a ground ring to transmit a ground signal (Vs s) to the array of subpixels. The data driver circuit, scan driver circuit, power supply line, and ground ring can all be connected to a flexible circuit board (FCB) which includes a power source for supplying power to the power supply line and a power source ground line electrically connected to the ground ring. It is to be appreciated, that this is one exemplary embodiment for a display panel, and alternative configurations are possible. For example, any of the driver circuits can be located off the display substrate 300, or alternatively on a back surface of the display substrate 300. Likewise, the working circuitry (e.g. transistors, capacitors, etc.) formed within the substrate 300 can be replaced with microdriver chips 350 bonded to the top surface of the substrate 300 as illustrated in FIG. 18B.

In the particular embodiment illustrated in FIG. 18A, the TFT substrate includes a switching transistor T1 connected to a data line from the driver circuit and a driving transistor T2 connected to a power line connected to the power supply line. The gate of the switching transistor T1 may also be connected to a scan line from the scan driver circuit. A patterned bank layer 326 including bank openings 327 is formed over the substrate 300. In an embodiment, bank openings 327 correspond to subpixels. Bank layer 326 may be formed by a variety of techniques such as ink jet printing, screen printing, lamination, spin coating, CVD, PVD and may be formed of opaque, transparent, or semitransparent materials. In an embodiment, bank layer 326 is formed of an insulating material. In an embodiment, bank layer is formed of a black matrix material to absorb emitted or ambient light.

Thickness of the bank layer 326 and width of the bank openings 327 may depend upon the height of the LEDs 150 transferred to and bonded within the openings, height of the electrostatic transfer heads, and resolution of the display panel. In an embodiment, exemplary thickness of the bank layer 326 is between 1 µm-50 µm.

Electrically conductive bottom electrodes 342, ground tie lines 344 and ground ring 316 may optionally be formed over the display substrate 300. In the embodiments illustrated an arrangement of ground tie lines 344 run between bank openings 328 in the pixel area 304 of the display panel. Ground tie lines 344 may be formed on the bank layer 326 or alternative, openings 332 may be formed in the bank layer 326 to expose ground tie lines 344 beneath bank layer 326. In an embodiment, ground tie lines 344 are formed between the bank openings 327 in the pixel area and are electrically connected to the ground ring 316 or a ground line in the non-display area. In this manner, the Vss signal may be more uniformly applied to the matrix of subpixels resulting in more uniform brightness across the display panel.

A passivation layer 348 formed around the LEDs 150 within the bank openings 327 may perform functions such as preventing electrical shorting between the top and bottom electrode layers 318, 342 and providing for adequate step coverage of top electrode layer 318 between the top conductive contacts 142 and ground tie lines 344. The passivation layer 348 may also cover any portions of the bottom electrode layer 342 to prevent possible shorting with the top electrode layer 318. In accordance with embodiments, the passivation layer 348 may be formed of a variety of materials such as, but not limited to epoxy, acrylic (polyacrylate) such as poly(methyl methacrylate) (PMMA), benzocyclobutene (BCB), polymide, and polyester. In an embodiment, passivation layer 348 is formed by ink jet printing or screen printing around the LED devices 156 to fill the subpixel areas defined by bank openings 327.

Top electrode layer 318 may be opaque, reflective, transparent, or semi-transparent depending upon the particular application. In top emission display panels the top electrode layer 318 may be a transparent conductive material such as amorphous silicon, transparent conductive polymer, or transparent conductive oxide. Following the formation of top electrode layer 318 and encapsulation layer 346 is formed over substrate 300. For example, encapsulation layer 346 may be a flexible encapsulation layer or rigid layer.

In an embodiment, one or more LEDs 150 are arranged in a subpixel circuit. A first terminal (e.g. bottom conductive contact) of the LED 150 is coupled with a driving transistor. For example, the LED 150 can be bonded to a bonding pad coupled with the driving transistor. In an embodiment, a redundant pair of LEDs 150 is bonded to the bottom electrode 342 that is coupled with the driving transistor T2. The one or more LEDs 150 may be any of the LEDs described herein. A ground line is electrically coupled with a second terminal (e.g. top conductive contact) for the one or more LEDs.

A current can be driven through the one or more LEDs, for example, from the driving transistor T2. In a high side drive configuration the one or more LEDs may be on the drain side of a PMOS driver transistor or a source side of an NMOS driver transistor so that the subpixel circuit pushes current through the p-terminal of the LED. Alternatively, the subpixel circuit can be arranged in a low side drive configuration in which case the ground line becomes the power line and current is pulled through the n-terminal of the LED.

Figure 19:
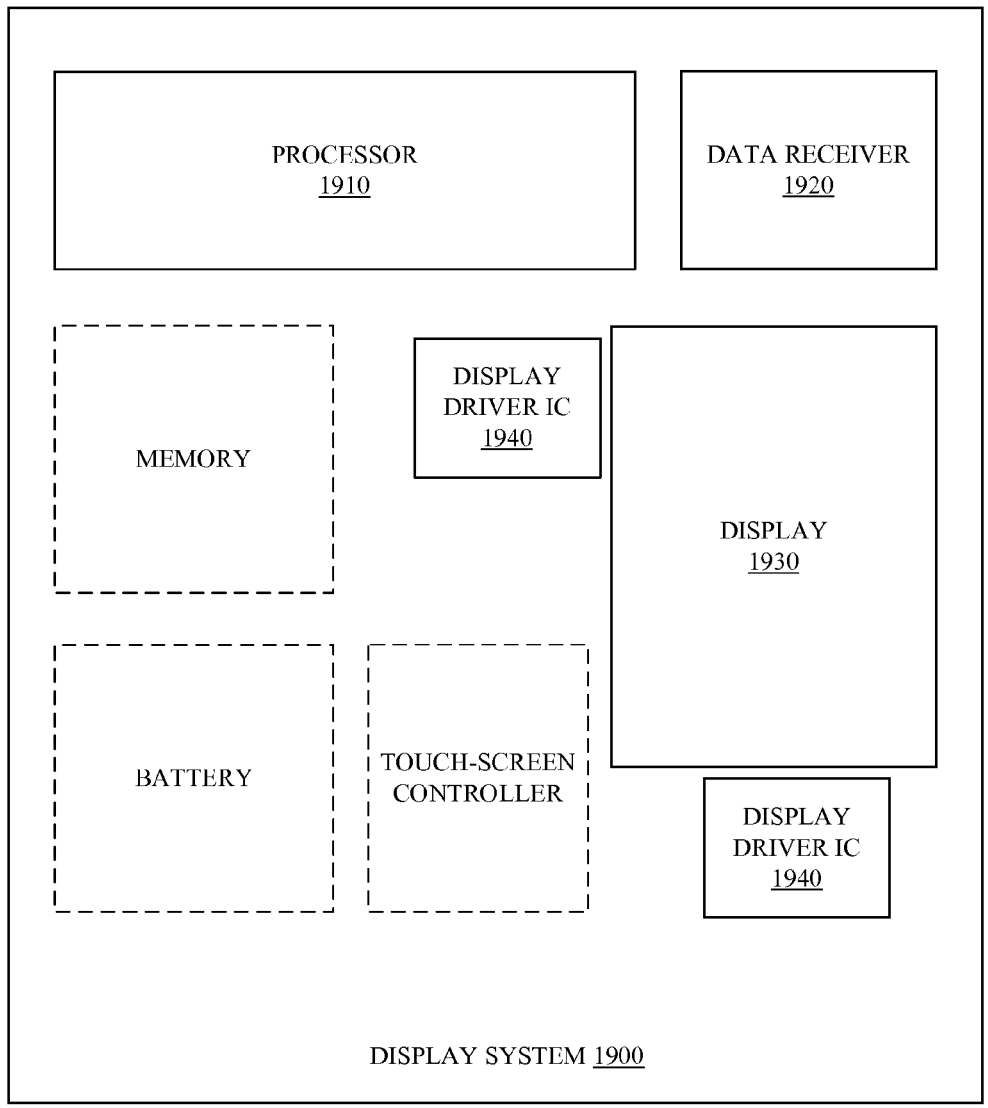
FIG. 19 is a schematic illustration of a display system in accordance with an embodiment.

FIG. 19 illustrates a display system 1900 in accordance with an embodiment. The display system houses a processor 1910, data receiver 1920, a display 1930, and one or more display driver ICs 1940, which may be scan driver ICs and data driver ICs. The data receiver 1920 may be configured to receive data wirelessly or wired. Wireless may be implemented in any of a number of wireless standards or protocols. The one or more display driver ICs 1940 may be physically and electrically coupled to the display 1930.

In some embodiments, the display 1930 includes one or more LEDs that are formed in accordance with embodiments described above. Depending on its applications, the display system 1900 may include other components. These other components include, but are not limited to, memory, a touch-screen controller, and a battery. In various implementations, the display system 1900 may be a television, tablet, phone, laptop, computer monitor, kiosk, digital camera, handheld game console, media display, ebook display, or large area signage display.

Figure 20:
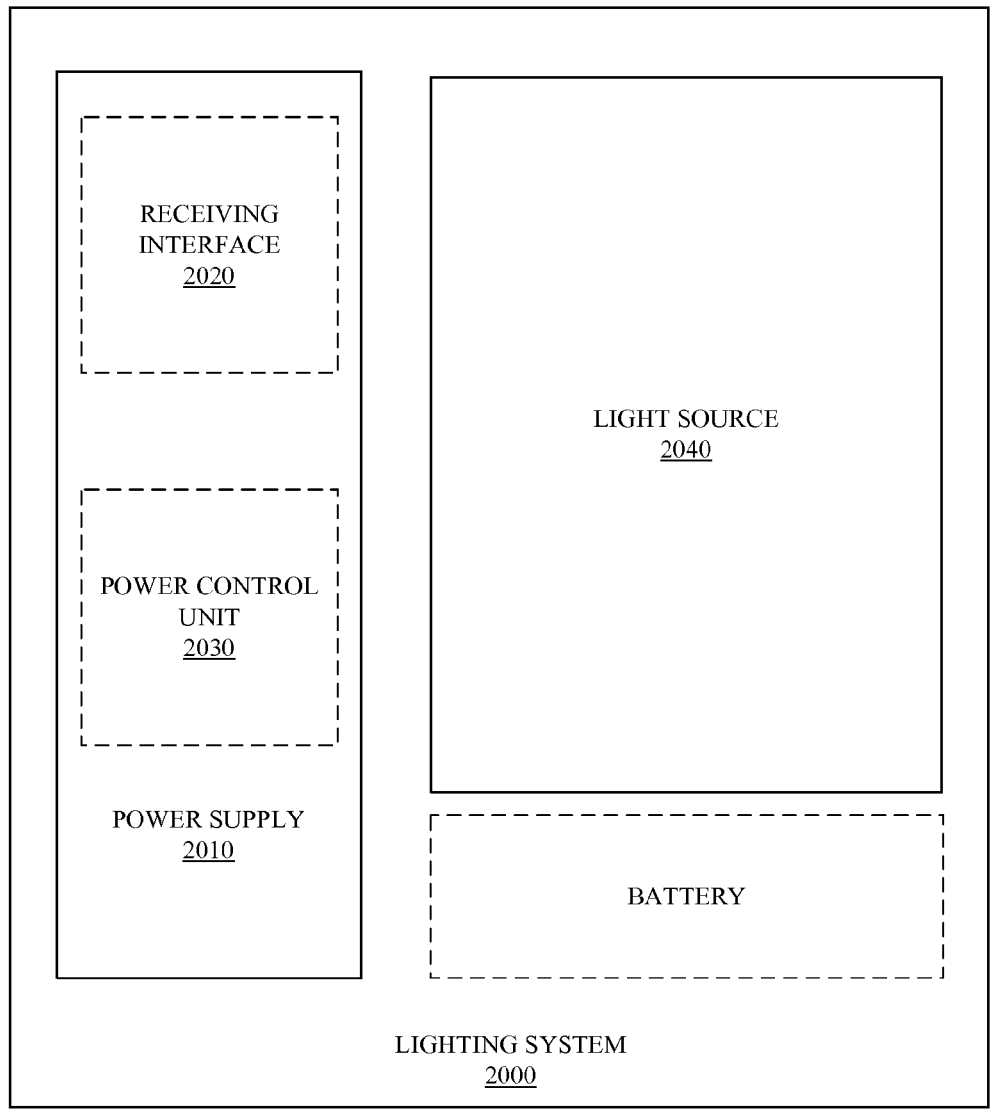
FIG. 20 is a schematic illustration of a lighting system in accordance with an embodiment.

FIG. 20 illustrates a lighting system 2000 in accordance with an embodiment. The lighting system houses a power supply 2010, which may include a receiving interface 2020 for receiving power, and a power control unit 2030 for controlling power to be supplied to the light source 2040. Power may be supplied from outside the lighting system 2000 or from a battery optionally included in the lighting system 2000. In some embodiments, the light source 2040 includes one or more LEDs that are formed in accordance with embodiments described above. In various implementations, the lighting system 2000 may be interior or exterior lighting applications, such as billboard lighting, building lighting, street lighting, light bulbs, and lamps.

In utilizing the various aspects of the embodiments, it would become apparent to one skilled in the art that combinations or variations of the above embodiments are possible for forming LEDs. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting diode (LED) comprising:
   a p-n diode layer including:
   a top current spreading layer;
   a bottom current spreading layer;
   an active layer between the top current spreading layer and the bottom current spreading layer; and
   p-n diode layer sidewalls spanning the top current spreading layer, the active layer, and the bottom current spreading layer;
   wherein lateral edges of the active layer are internally confined inside the p-n diode layer sidewalls.

2. The light emitting diode of claim 1, further comprising an intermixed passivation region surrounding the active layer and within the p-n diode layer sidewalls.

3. The light emitting diode of claim 2, wherein the intermixed passivation region comprises a higher bandgap energy than the active layer.

4. The light emitting diode of claim 3, wherein the wherein the intermixed passivation region comprises a p-dopant selected from the group consisting of Zn and Mg.

5. The light emitting diode of claim 2, further comprising a top cladding layer and a bottom cladding layer on opposite sides of the active layer, and the intermixed passivation region comprises an alloy of the top cladding layer, the active layer, and the bottom cladding layer.

6. The light emitting diode of claim 2, wherein the wherein the intermixed passivation region comprises a species selected from the group consisting of Fe, Cr, and Ni.

7. The light emitting diode of claim 2, wherein the active layer comprises InGaP, and the intermixed passivation region comprises an alloy of AlInGaP surrounding the active layer.

8. The light emitting diode of claim 1, wherein the active layer comprises a phosphorous based semiconductor.

9. The light emitting diode of claim 8, wherein the lateral edges of the active layer are displaced into an interior of the LED by notching followed by surface conversion of surrounding layers.

10. The light emitting diode of claim 1, wherein the active layer comprises a nitride based semiconductor.

11. The light emitting diode of claim 10, wherein the lateral edges of the active layer are displaced into an interior of the LED by mass transport.

12. A light emitting diode (LED) comprising:
a p-n diode layer including:
a top current spreading layer;
a bottom current spreading layer;
an active layer between the top current spreading layer and the bottom current spreading layer;
p-n diode layer sidewalls spanning the top current spreading layer, the active layer, and the bottom current spreading layer; and
a diffused passivation layer within the p-n diode layer sidewalls.

13. The light emitting diode of claim 12, wherein the diffused passivation layer comprises a p-dopant.

14. The light emitting diode of claim 13, wherein the diffused passivation layer is within sidewalls of the top current spreading layer, the bottom current spreading layer, and the active layer, the top current spreading layer is doped with an n-type dopant, and the diffused passivation layer within the top current spreading layer is net p-type.

15. The light emitting diode of claim 12, further comprising:
a top cladding layer and a bottom cladding layer on opposite sides of the active layer;
wherein the diffused passivation layer is within sidewalls of the top current spreading layer, the top cladding layer, the active layer, the bottom cladding layer, and the bottom current spreading layer.

16. The light emitting diode of claim 12, wherein the active layer comprises a phosphorous based semiconductor.

17. The light emitting diode of claim 12, wherein the diffused passivation layer comprises a species selected from the group consisting of Fe, Cr, and Ni.

18. A light emitting diode (LED) comprising:
a p-n diode layer including:
a top current spreading layer;
a bottom current spreading layer;
an active layer between the top current spreading layer and the bottom current spreading layer, wherein the active layer is phosphorus based; and
p-n diode layer sidewalls spanning the top current spreading layer, the active layer, and the bottom current spreading layer; and
an AlInP passivation layer laterally surrounding the p-n diode layer sidewalls.

19. The light emitting diode of claim 18, wherein the active layer comprises a phosphorous based semiconductor.

20. The light emitting diode of claim 19, wherein the diffused passivation layer comprises a p-dopant.

* * * * *